United States Patent
Okuyama et al.

(10) Patent No.: US 11,114,166 B2
(45) Date of Patent: Sep. 7, 2021

(54) SEMICONDUCTOR MEMORY DEVICE

(71) Applicant: TOSHIBA MEMORY CORPORATION, Tokyo (JP)

(72) Inventors: Atsushi Okuyama, Yokohama Kanagawa (JP); Yoshihiko Kamata, Yokohama Kanagawa (JP); Hiromitsu Komai, Kamakura Kanagawa (JP); Takuyo Kodama, Sagamihara Kanagawa (JP); Yuki Ishizaki, Yokohama Kanagawa (JP); Yoko Deguchi, Yokohama Kanagawa (JP); Hiroyuki Kaga, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/561,454

(22) Filed: Sep. 5, 2019

(65) Prior Publication Data

US 2020/0202948 A1 Jun. 25, 2020

(30) Foreign Application Priority Data

Dec. 21, 2018 (JP) .............................. JP2018-240131

(51) Int. Cl.
*G11C 16/24* (2006.01)
*G11C 16/04* (2006.01)
(Continued)

(52) U.S. Cl.
CPC .......... *G11C 16/24* (2013.01); *G11C 11/5642* (2013.01); *G11C 11/5671* (2013.01); *G11C 16/0483* (2013.01); *G11C 16/26* (2013.01); *H01L 27/11556* (2013.01); *H01L 27/11582* (2013.01)

(58) Field of Classification Search
CPC ..... G11C 16/26; G11C 16/24; G11C 11/5642; G11C 11/5671; G11C 16/0483; G11C 2211/5621; G11C 16/32; H01L 27/11582; H01L 27/11556
See application file for complete search history.

(56) References Cited

U.S. PATENT DOCUMENTS 10,037,813 B2 7/2018 Maejima et al.
2009/0267128 A1 10/2009 Maejima
(Continued)

FOREIGN PATENT DOCUMENTS

JP 2013196737 A 9/2013
JP 2017142874 A 8/2017

*Primary Examiner* — Jay W. Radke
(74) *Attorney, Agent, or Firm* — Holtz, Holtz & Volek PC

(57) ABSTRACT

According to one embodiment, a semiconductor memory device includes a bit line electrically connected to a memory cell, a first node electrically connected to the bit line, a first driver configured to increase a voltage of the first node to a first voltage, a first buffer circuit configured to store data based on the voltage of the first node, a bus electrically connected to the first buffer circuit, a first transistor electrically connected between the first node and the bus, and a second buffer circuit electrically connected to the bus. The first buffer circuit is electrically connected to an input terminal of the first driver. The first driver changes a voltage of the bus based on the data stored in the first buffer circuit.

16 Claims, 25 Drawing Sheets

(51) Int. Cl.
  *G11C 11/56* (2006.01)
  *G11C 16/26* (2006.01)
  H01L 27/11582 (2017.01)
  H01L 27/11556 (2017.01)

(56) References Cited

U.S. PATENT DOCUMENTS

| | | |
|---|---|---|
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2013/0250684 A1 | 9/2013 | Fujimura et al. |
| 2014/0269061 A1 | 9/2014 | Tran et al. |
| 2014/0269096 A1* | 9/2014 | Kamata ............. G11C 16/3459 365/185.21 |
| 2014/0286104 A1* | 9/2014 | Kamata ............. G11C 16/0483 365/185.21 |
| 2017/0140823 A1 | 5/2017 | Miissiroli et al. |
| 2017/0365348 A1 | 12/2017 | Kamata et al. |

* cited by examiner

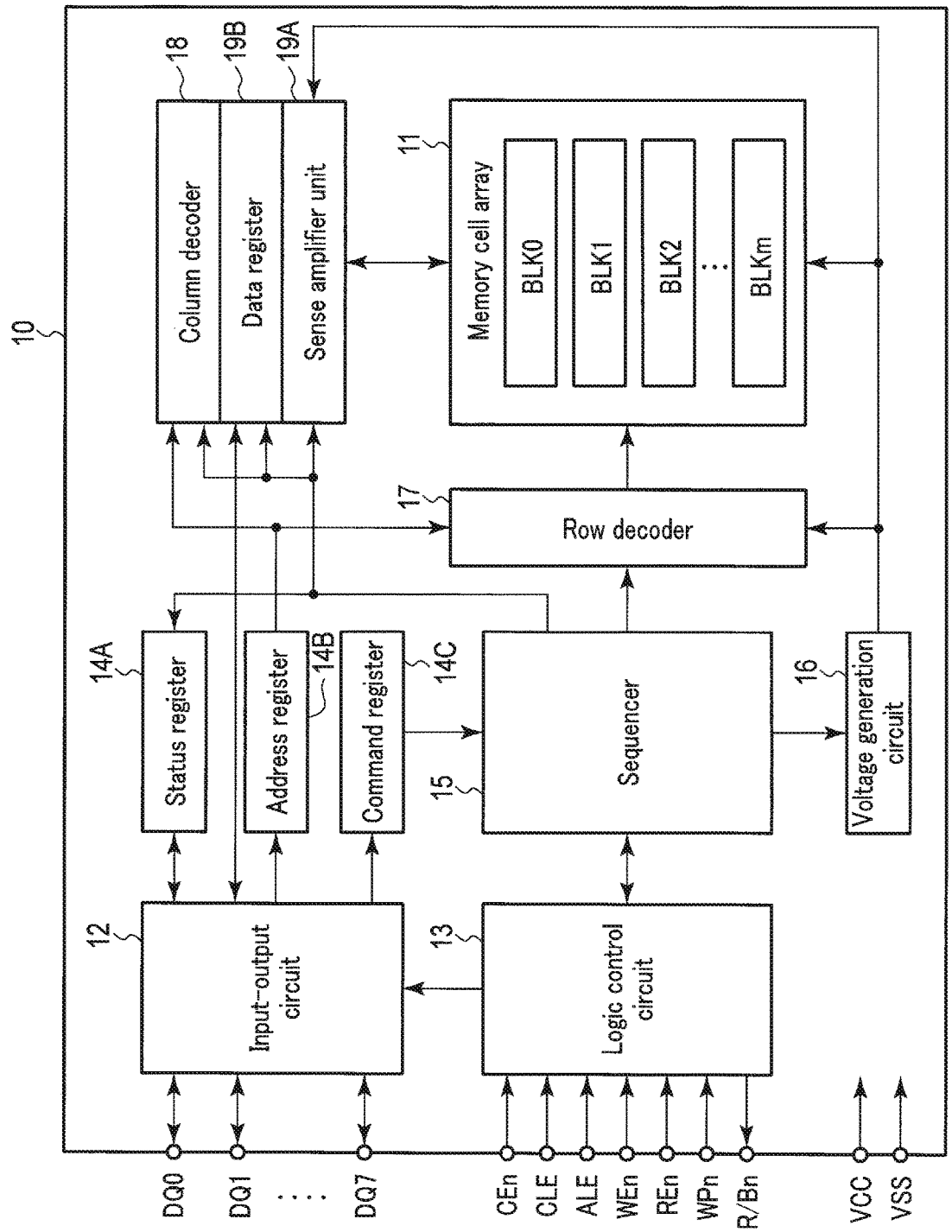
F I G. 2

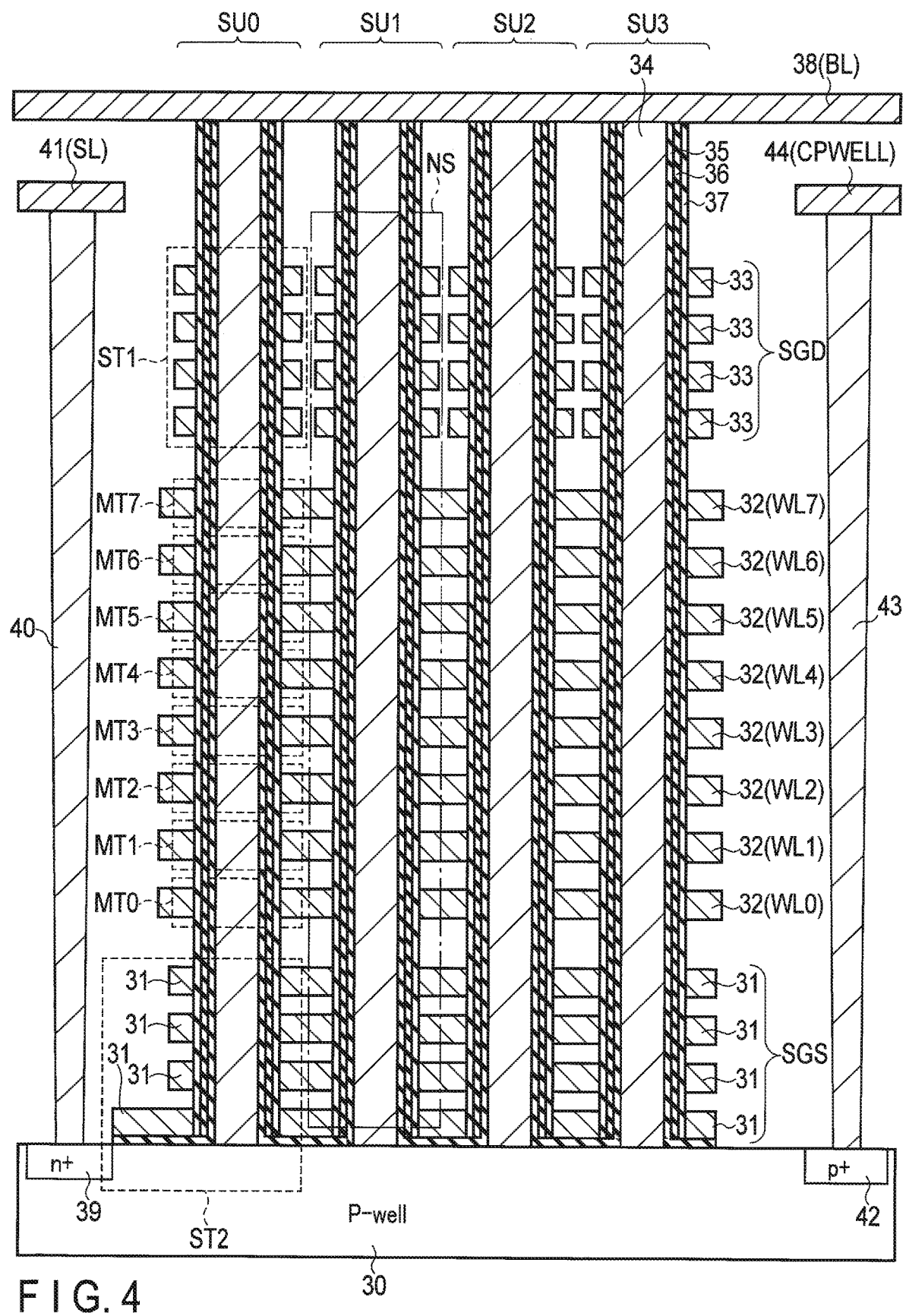
F I G. 4

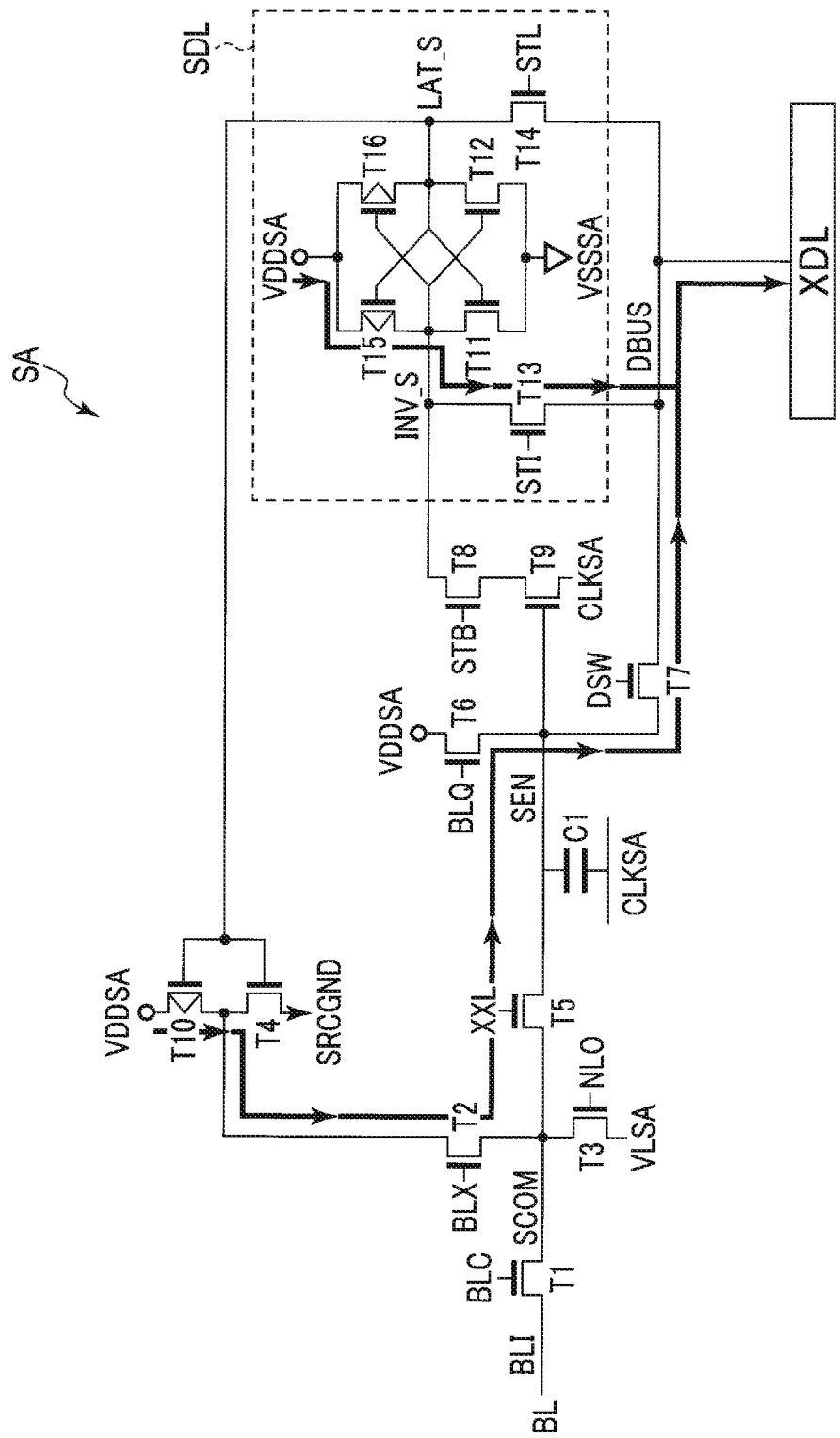
F I G. 11

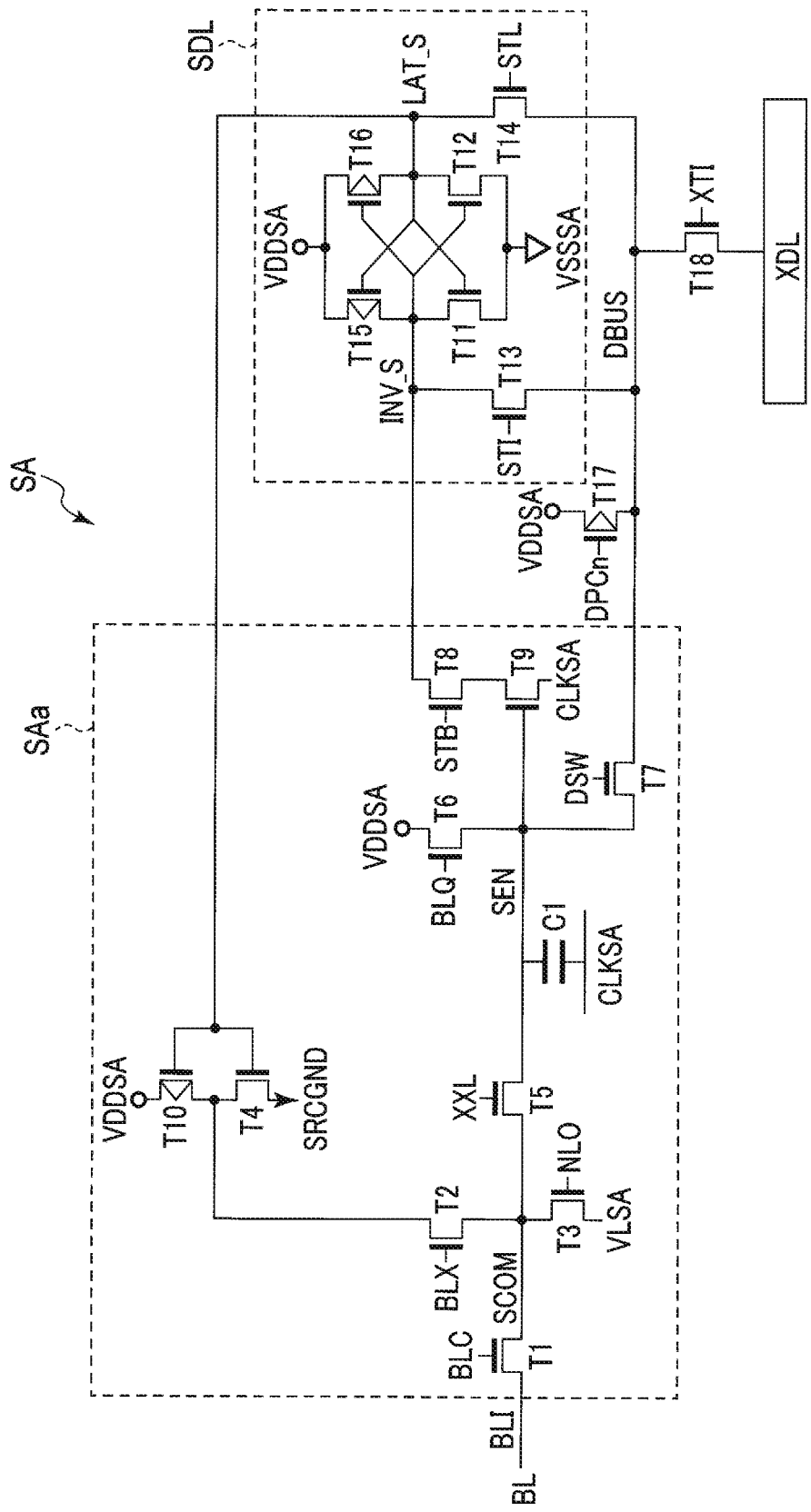
F I G. 19

SEMICONDUCTOR MEMORY DEVICE

CROSS-REFERENCE TO RELATED APPLICATIONS

This application is based upon and claims the benefit of priority from the Japanese Patent Application No. 2018-240131, filed Dec. 21, 2018, the entire contents of which are incorporated herein by reference.

FIELD

Embodiments described herein relate generally to a semiconductor memory device.

BACKGROUND

A semiconductor memory device in which memory cells are three-dimensionally arranged is known.

BRIEF DESCRIPTION OF THE DRAWINGS

FIG. 2 is a block diagram showing a configuration of the semiconductor memory device of the first embodiment.

FIG. 4 is a cross-sectional view of a partial region of the block according to the first embodiment.

FIG. 11 shows a manner of data transfer from a data latch circuit SDL to a data latch circuit XDL according to the first embodiment.

FIG. 19 is a circuit diagram of a sense amplifier section and a data latch circuit in a sense amplifier according to a second embodiment.

DETAILED DESCRIPTION

In general, according to one embodiment, a semiconductor memory device includes a bit line electrically connected to a memory cell; a first node electrically connected to the bit line; a first driver configured to increase a voltage of the first node to a first voltage; a first buffer circuit configured to store data based on the voltage of the first node; a bus electrically connected to the first buffer circuit; a first transistor electrically connected between the first node and the bus; and a second buffer circuit electrically connected to the bus. The first buffer circuit is electrically connected to an input terminal of the first driver. The first driver changes a voltage of the bus based on the data stored in the first buffer circuit.

In the description of the embodiments below, components having the same functions and configurations will be denoted by the same reference symbols. Each of the embodiments described below merely shows an exemplary apparatus or method for implementing the technical idea of the embodiment. The materials, shapes, structures, arrangements, and the like, of the components are not limited to those described below.

Each of the function blocks can be implemented in the form of hardware, computer software, or a combination thereof. The function blocks need not be categorized as shown in the example below. For example, some functions may be implemented by a function block other than the exemplary function blocks. The exemplary function blocks may be further divided into function sub-blocks. A three-dimensionally stacked nonvolatile flash memory with memory cell transistors stacked above a semiconductor substrate will be described below as an example of a semiconductor memory device.

1. First Embodiment

A semiconductor memory device according to a first embodiment will be described.

1.1. Configuration of Memory System Including Semiconductor Memory Device

Figure 1:
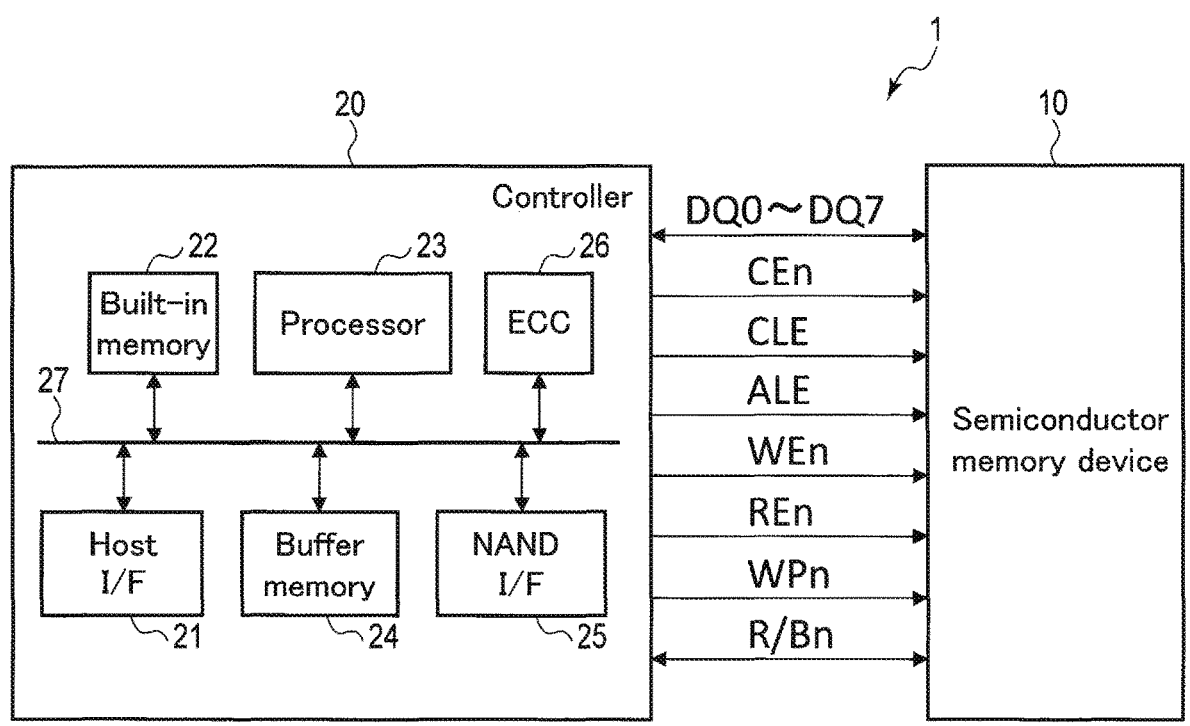
FIG. 1 is a block diagram of a memory system that includes a semiconductor memory device of a first embodiment.

First of all, a configuration of a memory system 1 that includes the semiconductor memory device of the first embodiment will be described with reference to FIG. 1. FIG. 1 is a block diagram showing a configuration of the memory system 1 that includes a semiconductor memory device 10 of the first embodiment. The memory system 1 includes the semiconductor memory device (NAND flash memory) 10 and a controller 20.

The memory system 1 may be formed of a plurality of chips and mounted on a motherboard of a host device (not shown). The memory system 1 may also be formed as a system LSI (large-scale integrated circuit) or an. SoC (system on chip) implemented by a single module. Examples of the memory system 1 include a memory card such as an SD™ card, a solid state drive (SSD), and an embedded multimedia card (eMMC).

The semiconductor memory device 10 includes a plurality of memory cells (also referred to as "memory cell transistors"), and stores data in a nonvolatile manner. The configuration of the semiconductor memory device 10 will be detailed later.

In response to a command from a host device, the controller 20 accesses the semiconductor memory device 10 and controls the semiconductor memory device 10. Namely, the controller 20 instructs the semiconductor memory device 10 to perform a write (also referred to as a "program") operation, read operation, erase operation, and the like. In addition, the controller 20 controls a memory space of the semiconductor memory device 10.

The controller 20 includes a host interface circuit (host I/F) 21, a built-in memory 22, a processor 23, a buffer memory 24, a NAND interface circuit (NAND I/F) circuit 25, and an error-checking-and-correcting (ECC) circuit 26. These modules are connected to one another via a bus 27.

The host interface circuit 21 is connected to a host device via a host bus. The host interface circuit 21 transfers commands and data received from the host device to the processor 23 and the buffer memory 24, respectively. The host interface circuit 21 also transfers data in the buffer memory 24 to the host device in response to a command from the processor 23.

The processor 23 includes, for example, a central processing unit (CPU). The processor 23 controls the overall operation of the controller 20. For example, when the processor 23 receives a write command from the host device, the processor 23 issues, in response thereto, a write command to the semiconductor memory device 10 via the NAND interface circuit 25. The processor 23 performs its functions in a similar manner for the read and erase operations. The processor 23 also performs various kinds of processing, such as wear leveling, for controlling the semiconductor memory device 10. The operation of the controller 20 may be implemented either by the processor 23 executing software (or firmware) or by hardware.

The built-in memory 22 includes a semiconductor memory, such as a DRAM or an SRAM, and is used as an operation area of the processor 23. The built-in memory 22 stores, for example, firmware for managing the semiconductor memory device 10, and various management tables.

The buffer memory 24 temporarily stores write data to, and read data from, the semiconductor memory device 10. The buffer memory 24 may comprises a DRAM, an SRAM, or the like.

The NAND interface circuit 25 is connected to the semiconductor memory device 10 via a NAND bus, and controls communication with the semiconductor memory device 10. Based on a command received from the processor 23, the NAND interface circuit 25 transmits various signals to, and receives various signals from, the semiconductor memory device 10.

The ECC circuit 26 performs error detection and error correction processes for the data stored in the semiconductor memory device 10. Namely, in the write operation, the ECC circuit 26 generates an error correction code for write data and transmits said write data with said error correction code to the NAND interface circuit 25. Also, in the read operation, the ECC circuit 26 performs error detection and/or error correction for read data using an error correction code included in the read data.

1.2. Configuration of Semiconductor Memory Device 10

A configuration of the semiconductor memory device 10 of the first embodiment will be described with reference to FIG. 2. FIG. 2 is a block diagram showing the configuration of the semiconductor memory device 10 shown in FIG. 1.

The semiconductor memory device 10 includes a memory cell array 11, an input-output circuit 12, a logic control circuit 13, a register group (including a status register 14A, an address register 14B, and a command register 14C), a sequencer (control circuit) 15, a voltage generation circuit 16, a row decoder 17, a column decoder 18, a sense amplifier unit 19A, and a data register (data cache) 19B.

The memory cell array 11 includes a plurality of blocks BLK0, BLK1, BLK2, . . . BLKm (with m being an integer of 0 or more), each of which includes a plurality of non-volatile memory cells associated with rows and columns. Hereinafter, a term "block BLK" denotes each of the blocks BLK0 to BLKm. The memory cell array 11 stores data provided from the controller 20. A plurality of bit lines, a plurality of word lines, and a source line, etc., are arranged in the memory cell array 11 in order to apply a voltage to the memory cell transistors. The memory cell array 11 and the block BLK will be detailed later.

The input-output circuit 12 and the logic control circuit 13 are connected to the controller 20 via the NAND bus. The input-output circuit 12 transmits and receives input-output signals DQ (e.g., DQ0 to DQ7) to and from the controller 20 via the NAND bus.

The logic control circuit 13 receives external control signals, such as a chip enable signal CEn, a command latch enable signal CLE, an address latch enable signal ALE, a write enable signal WEn, a read enable signal REn, and a write protect signal WPn, from the controller 20 via the NAND bus. The letter "n" attached to the name of the signal denotes that the signal is active low. Also, the logic control circuit 13 transmits a ready/busy signal R/Bn to the controller 20 via the NAND bus.

The chip enable signal CEn enables selection of the semiconductor memory device 10, and is asserted when the semiconductor memory device 10 is selected. The command latch enable signal CLE enables a command transmitted as the signal DQ to be latched into the command register 14C. The address latch enable signal ALE enables an address transmitted as the signal DQ to be latched into the address register 14B. The write enable signal WEn enables a write operation. The read enable signal REn enables a read operation. The write protect signal WPn is asserted when prohibiting write and erase operations. The ready/busy signal R/Bn indicates whether the semiconductor memory device 10 is in a "ready" or "busy" state. The ready state refers to a state where a command can be received from an external device. The busy state refers to a state where a command cannot be received from an external device. The controller 20 can determine the state of the semiconductor memory device 10 by receiving the ready/busy signal R/Bn from the semiconductor memory device 10.

The status register 14A temporarily stores data necessary for the operation of the semiconductor memory device 10. The address register 14B temporarily stores an address. The command register 14C temporarily stores a command. The status register 14A, the address register 14B, and the command register 14C comprises, for example, an SRAM.

The sequencer 15 receives a command from the command register 14C, and controls the entire semiconductor memory device 10 in accordance with a sequence based on the received command.

The voltage generation circuit 16 receives a power supply voltage VCC from the outside of the semiconductor memory device 10, and uses said power supply voltage to generate a plurality of voltages necessary for write, read, and erase operations. The voltage generation circuit 16 supplies the generated voltage to the memory cell array 11, the row decoder 17, the sense amplifier unit 19A, and the like.

The row decoder 17 receives a row address from the address register 14B, and decodes the received row address. The row decoder 17 selects one of the blocks BLK, and further selects a word line in the selected block BLK based on the decoded row address. The row decoder 17 also transfers a plurality of voltages necessary for write, read, and erase operations to the memory cell array 11.

The column decoder 18 receives a column address from the address register 14B, and decodes the received column address. The column decoder 18 selects a bit line based on the decoded column address.

In a read operation, the sense amplifier unit 19A detects and amplifies data read from the memory cell transistors out to the bit lines, and temporarily stores this data. Also, in a write operation, the sense amplifier unit 19A transfers, to the bit lines, a voltage based on the write data received from the controller 20.

In a read operation, the data register 19B temporarily stores the data transferred from the sense amplifier unit 19A, and transfers the held data to the input-output circuit 12 in series. Also, in a write operation, the data register 19B temporarily stores the data transferred in series from the input-output circuit 12, and transfers the held data to the sense amplifier unit 19A in parallel.

The power supply voltage VCC and a ground voltage VSB (e.g., 0 V) are supplied to the semiconductor memory device 10 via a corresponding terminal.

1.2.1. Configuration of Memory Cell Array 11

The memory cell array 11 includes the blocks BLK0 to BLKm, as described above. A circuit configuration of one block BLK will be described below.

Figure 3:
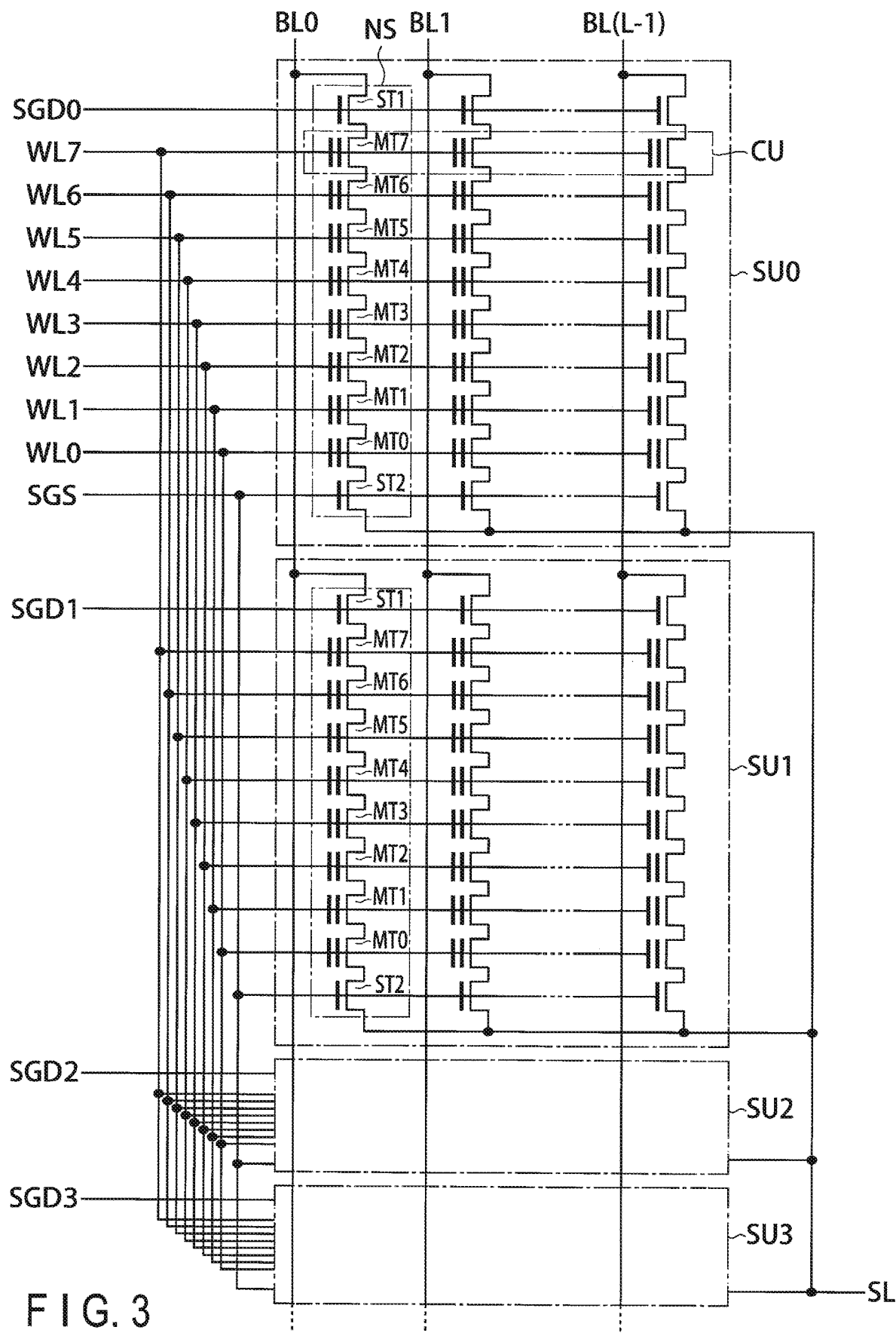
FIG. 3 is a circuit diagram of a block according to the first embodiment.

FIG. 3 is a circuit diagram of a block BLK included in the memory cell array 11. As shown in FIG. 3, the block BLK includes, for example, four string units SU0 to SU3. Hereinafter, a term "string unit SU" refers to each of the string units SU0 to SU3. The string unit SU includes a plurality of NAND strings NS.

Each of the NAND strings NS includes, for example, eight memory cell transistors MT0 to MT7, and select transistors ST1 and ST2. Hereinafter, a term "memory cell transistor MT" refers to each of the memory cell transistors MT0 to MT7. The memory cell transistor MT includes a control gate and a charge storage layer, and stores data in a nonvolatile manner. The memory cell transistors MT0 through MT7 are connected in series between the source of the select transistor ST1 and the drain of the select transistor ST2.

The gates of the select transistors ST1 of the string units SU0 through SU3 are connected to select gate lines SGD0 through SGD3, respectively. On the other hand, the gates of the select transistors ST2 of the string units SU0 through SU3 are connected to, for example, one select gate line SGS. The gates of the select transistors ST2 of the string units may be connected to different select gate lines SGS0 to SGS3, respectively. The control gates of the memory cell transistors MT0 to MT7, in the string units SU0 to SU3 in the block BLK, are connected to word lines WL0 through WL7, respectively.

In the memory cell array 11, the blocks BLK0 to BLKm share the bit lines BL0 to BL(L−1). L denotes a natural number of 2 or more. In the string units SU0 to SU3 in the block BLK, the respective bit lines BL are connected in common to the drains of the select transistors ST1 of the NAND strings NS in the same column. Namely, each bit line BL couples the NAND strings NS in common throughout the string units SU0 to SU3 in the same column. The sources of the select transistors ST2 are connected in common to a source line SL. Namely, the string unit SU includes a plurality of NAND strings NS that are connected to different bit lines BL and also to the same select gate line SGD.

The block BLK includes a plurality of string units SU that share the word lines WL.

The memory cell transistors MT, connected to a common word line WL in a string unit SU, are referred to as a "cell unit CU". The storage capacity of the cell unit CU changes in accordance with the number of bits of data stored in the memory cell transistors MT. For example, a cell unit CU stores one-page data when each memory cell transistor MT stores 1-bit data; two-page data when each memory cell transistor MT stores 2-bit data; and three-page data when each memory cell transistor MT stores 3-bit data.

The configuration of the memory cell array 11 is not limited to the above-described configuration. For example, the number of string units SU included in each block BLK is discretionary. The number of memory cell transistors MT and select transistors ST1 and ST2 included in each NAND string NS is also discretionary.

Also, the NAND string NS may include a dummy cell transistor. Specifically, two dummy cell transistors (not shown), for example, are connected in series between the select transistor ST2 and the memory cell transistor MT0. For example, two dummy cell transistors (not shown) are connected in series between the memory cell transistor MT7 and the select transistor ST1. Dummy word lines are connected to the gates of the dummy cell transistors. The dummy cell transistor has the same structure as that of the memory cell transistor MT. The dummy cell transistor is not configured to store data but functions to alleviate the disturbance that the memory cell transistor or the select transistor receives during write or erase operation.

1.2.2. Cross-Sectional Structure of Memory Cell Array 11

Next, a cross-sectional structure of the block BLK in the memory cell array 11 will be described. FIG. 4 is a cross-sectional view of a partial region of the block BLK. As shown in FIG. 4, a plurality of NAND strings NS are formed on a p-type well region 30. Namely, four interconnect layers 31, for example, functioning as the select gate line SGS, eight interconnect layers 32 functioning as the word lines WL0 to WL7, and four interconnect layers 33, for example, functioning as the select gate lines SGD are sequentially stacked on the well region 30. An insulating film (not shown) is formed between the respective interconnect layers that are stacked.

A pillar-shaped conductor 34 extending through the interconnect layers 31, 32, and 33 to reach the well region 30 is formed. A gate insulation film 35, a charge storage film (insulation film) 36, and a block insulation film 37 are sequentially formed on the side surface of the conductor 34. These films form the memory cell transistors MT and the select transistors ST1 and ST2. The conductor 34 functions as a current path of the NAND string NS, and is used as a region in which a channel of each transistor is formed. The upper terminal of the conductor 34 is connected to a metal interconnect layer 38 that functions as the bit line BL.

An $n^+$-type impurity diffusion layer 39 is formed in a surface region of the well region 30. A contact plug 40 is formed on the diffusion layer 39, and is connected to a metal interconnect layer 41 that functions as the source line SL. A $p^+$-type impurity diffusion layer 42 is also formed in the surface region of the well region 30. A contact plug 43 is formed on the diffusion layer 42, and is connected to a metal interconnect layer 44 that functions as a well interconnect CPWELL. The well interconnect CPWELL is used to apply potential to the conductor 34 via the well region 30.

A plurality of configurations as described above are arranged in a direction perpendicular to the sheet of FIG. 3 (depth direction), and a set of NAND strings NS aligned in the depth direction form the string unit SU.

The memory cell array 11 may have other configurations. The configuration of the memory cell array 11 is described in, for example, U.S. patent application Ser. No. 12/407,403 filed on Mar. 19, 2009 and entitled "THREE DIMENSIONAL STACKED NONVOLATILE SEMICONDUCTOR MEMORY." The configuration of the memory cell array 11 is also described in U.S. patent application Ser. No. 12/406,524 filed on Mar. 18, 2009 and entitled "THREE DIMENSIONAL STACKED NONVOLATILE SEMICONDUCTOR MEMORY," in U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME," and in U.S. patent application Ser. No. 12/532,030 filed on Mar. 23, 2009 and entitled "SEMICONDUCTOR MEMORY AND METHOD FOR MANUFACTURING SAME." The entire contents of these applications are incorporated herein by reference.

Data erasing can be performed either in units of blocks BLK, or smaller units. The erasing method is described in, for example, U.S. patent application Ser. No. 13/235,389 filed on Sep. 18, 2011 and entitled "NONVOLATILE SEMICONDUCTOR MEMORY DEVICE." It is also described in U.S. patent application Ser. No. 12/694,690 filed on Jan. 27, 2010 and entitled "NON-VOLATILE SEMICONDUCTOR STORAGE DEVICE." Furthermore, it is described in U.S. patent application Ser. No. 13/483,610 filed on May 30, 2012 and entitled "NONVOLATILE SEMICONDUCTOR MEMORY DEVICE AND DATA ERASE METHOD THEREOF." The entire contents of these applications are incorporated herein by reference.

1.2.3. Threshold Distributions of Memory Cell Transistors MT

Figure 5:
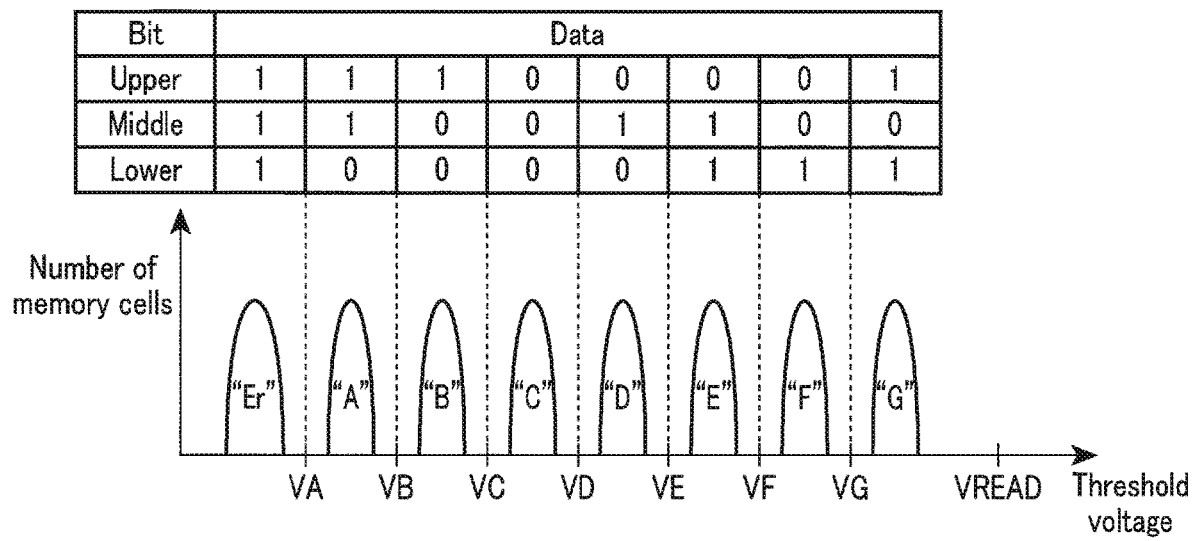
FIG. 5 shows data that may be taken by a memory cell transistor, and a threshold voltage distribution thereof, according to the first embodiment.

FIG. 5 shows data that may be taken by the memory cell transistor MT and a threshold voltage distribution hereof according to the first embodiment. The memory cell transistor MT can store data of 2 or more bits. A case where the memory cell transistor MT adopts a triple-level-cell (TLC) scheme that stores 3-bit data will be described below.

The 3-bit data is specified by a lower bit, a middle bit, and an upper bit. When the memory cell transistor MT stores three bits, the memory cell transistor MT has one of eight threshold voltages. The eight threshold voltages are referred to as states "Er," "A," "B," "C," "D," "E," "F," and "G" in ascending order of threshold voltage. The memory cell transistors MT belonging to each of the states "Er," "A," "B," "C," "D," "E," "F," and "G" form distributions of the threshold voltages shown in FIG. 5.

For example, data "111," "110, "100, "000," 010," "011," "001," and "101" are allocated to the states "Er," "A," "B," "C," "D," "E," "F," and "G," respectively. When the upper bit is defined as "X," the middle bit is defined as "Y," and the lower bit is defined as "Z," the arrangement of the bits is "X, Y, Z." The allocation of the threshold distribution and the data can be determined discretionarily.

In order to read data stored in a read-targeted memory cell transistor MT, the state to which the threshold voltage of the memory cell transistor MT belongs is determined. In order to determine the state, read voltages VA, VB, VC, VD, VE, VF, and VG are used.

The state "Er" corresponds to, for example, a state (erased state) in which data is erased. The threshold voltage of the memory cell transistors MT belonging to the state "Er" is lower than the voltage VA, and has, for example, a negative value.

The states "A" to "G" correspond to a state in which an electrical charge is injected into the charge storage layer and data is written to the memory cell transistor MT, and the threshold voltages of the memory cell transistors MT belonging to the states "A" to "G" have, for example, a positive value. The threshold voltage of the memory cell transistors MT belonging to the state "A" is equal to or higher than the voltage VA, and lower than the voltage VB. The threshold voltage of the memory cell transistors MT belonging to the state "B" is equal to or higher than the voltage VB, and lower than the voltage VC. The threshold voltage of the memory cell transistors MT belonging to the state "C" is equal to or higher than the voltage VC, and lower than the voltage VD. The threshold voltage of the memory cell transistors MT belonging to the state "D" is equal to or higher than the voltage VD, and lower than the voltage VE. The threshold voltage of the memory cell transistors MT belonging to the state "E" is equal to or higher than the voltage VE, and lower than the voltage VF. The threshold voltage of the memory cell transistors MT belonging to the state "F" is equal to or higher than the voltage VF, and lower than the voltage VG. The threshold voltage of the memory cell transistors MT belonging to the state "G" is equal to or higher than the voltage VG, and lower than the voltage VREAD.

The voltage VREAD is a voltage applied to the word lines WL connected to the memory cell transistors MT that are not of the read-targeted cell unit CU, and is higher than the threshold voltages of the memory cell transistors MT in any state. Namely, the memory cell transistor MT with the voltage VREAD applied to a control gate electrode is turned on, regardless of the data stored therein.

As described above, each memory cell transistor MT is set to any one of the eight states, and is capable of storing 3-bit data. Data is written and read in units of pages or units of cell units. When the memory cell transistor MT stores 3-bit data, the lower bit, the middle bit, and the upper bit are allocated to three pages in one cell unit CU. The pages written or read in a batch with respect to the lower bit, the middle bit, and the upper bit are referred to as a "lower page", a "middle page", and an "upper page", respectively.

1.2.4. Configurations of Sense Amplifier Unit 19A and Data Register 19B

Figure 6:
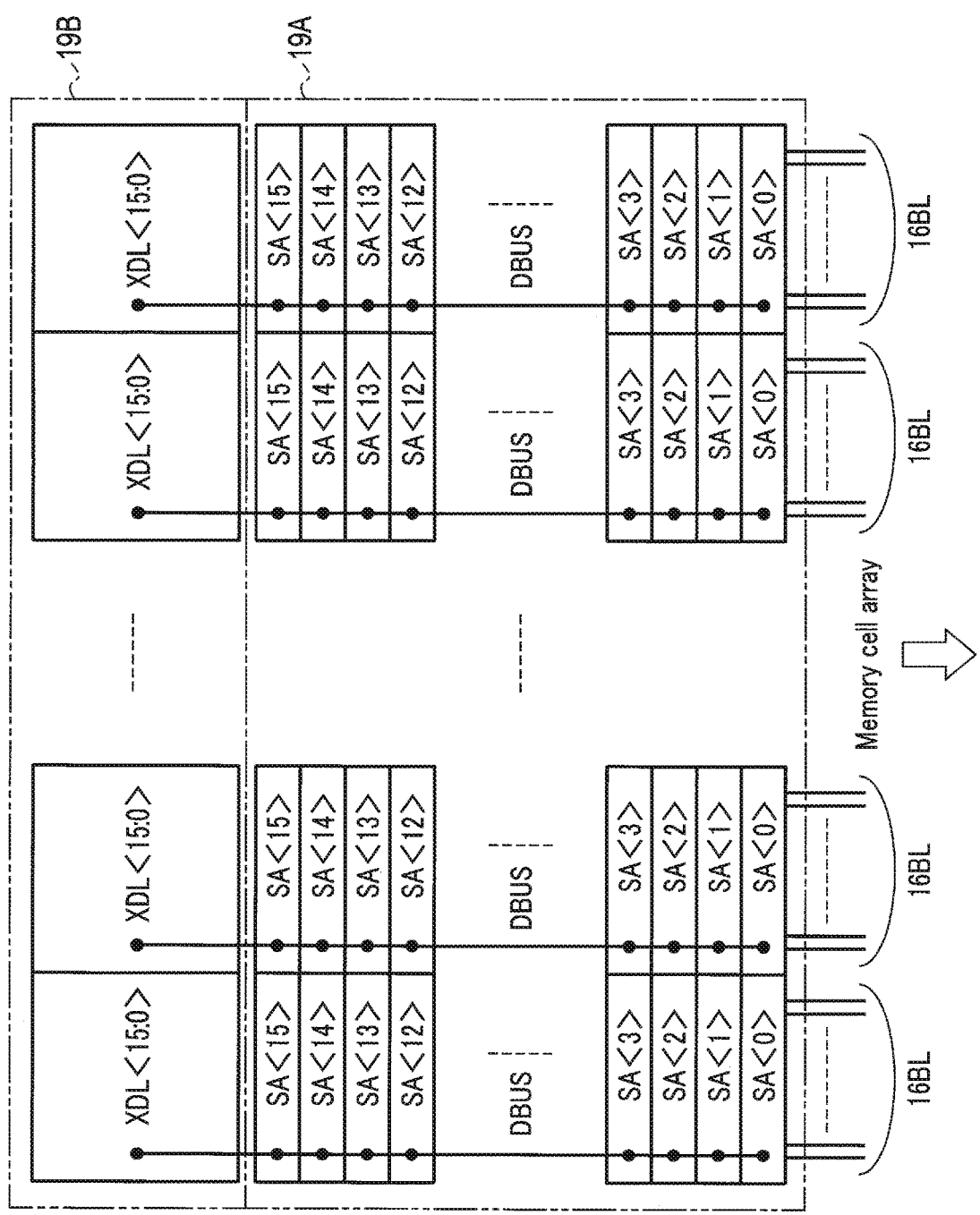
FIG. 6 is a block diagram showing configurations of a sense amplifier unit and a data register according to the first embodiment.

Next, configurations of the sense amplifier unit and the data register will be described with reference to FIG. 6. FIG. 6 is a block diagram showing configurations of the sense amplifier unit 19A and the data register 19E. The sense amplifier unit 19A includes a plurality of sense amplifiers SA. One data bus DBUS is provided for a predetermined number of sense amplifiers SA among the plurality of sense amplifiers SA. For example, 16 sense amplifiers, SA<0>, SA<1>, SA<15>, are connected to a single data bus DBUS.

The number of sense amplifiers SA connected to one data bus DBUS is discretionary. In the descriptions provided below, when the 16 sense amplifiers, SA<0> to SA<15>, connected to one data bus DBUS are distinguished from one another, they will be indicated by SA<0>, SA<1>, SA<15>, respectively. When the 16 sense amplifiers, SA<0> to SA<15>, are not distinguished from one another, they will be indicated as a "sense amplifier SA" or "sense amplifiers SA" to indicate each of them.

The sense amplifier SA provided for each bit line BL, for example, senses data read from the corresponding bit line BL, and transfers write data to the corresponding bit line BL.

The data register 19B includes a plurality of data latch circuits (buffer circuits) XDL corresponding to the plurality of sense amplifiers SA, The data latch circuit XDL is provided for each sense amplifier SA. For example, each of the 16 data latch circuits XDL<15:0> is provided to correspond to each of the sense amplifiers SA<0> to SA<15>. The data latch circuits XDL<15:0> are connected to one data bus DBUS. The number of data latch circuits XDL connected to one data bus DBUS is discretionary. Each data latch circuit XDL temporarily stores (or latches) data related to the corresponding sense amplifier SA.

Each of the data latch circuits XDL is connected to the input-output circuit 12. The data latch circuits XDL temporarily store read data transferred from the sense amplifiers SA, and temporarily store write data transferred from the input-output circuit 12. For example, data read by the sense amplifiers SA is held in the sense amplifiers SA, and is further held in the data latch circuits XDL via the data bus DBUS. Thereafter, the data held in the data latch circuits XDL is transferred from the data latch circuits XDL to the input-output circuit 12. The data transfer between the input-output circuit 12 and the sense amplifiers SA is performed using the sense amplifiers SA corresponding to one page and the data latch circuits XDL corresponding to one page.

Also, the write data input to the input-output circuit 12 is transferred from the input-output circuit 12 to the data latch circuits XDL and held in the data latch circuits XDL. Thereafter, the write data is transferred to the sense amplifiers SA via the data bus DBUS. The data transfer between the input-output circuit 12 and the sense amplifiers SA is performed using the data latch circuits XDL corresponding to one page and the sense amplifiers SA corresponding to one page.

1.2.5. Configuration of Sense Amplifier SA

Figure 7:
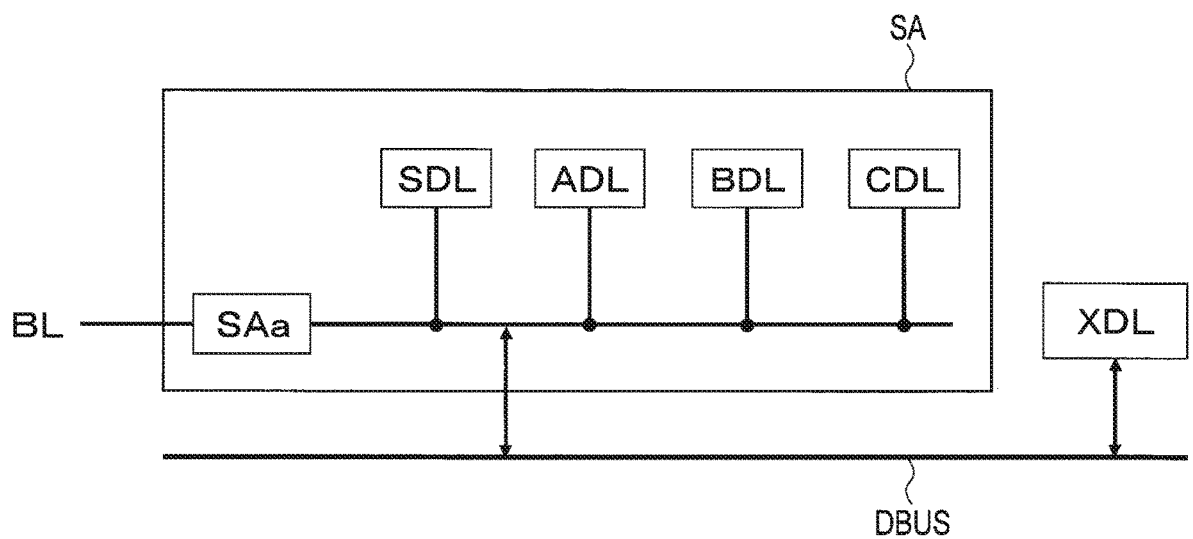
FIG. 7 is a block diagram showing a configuration of a sense amplifier connected to a data bus according to the first embodiment.

Next, a configuration of the sense amplifier SA in the sense amplifier unit 19A will be described with reference to FIG. 7. As described above, a plurality of sense amplifiers SA are connected to one data bus DBUS. FIG. 7 is a block diagram showing a configuration of a sense amplifier SA connected to the data bus DBUS.

Each sense amplifier SA includes a sense amplifier section SAa, and data latch circuits (buffer circuits) SDL, ADL, BDL, and CDL. The sense amplifier section SAa and the data latch circuits SDL, ADL, BDL, and CDL are connected to each other so that data can be transferred therebetween.

In a read operation, the sense amplifier section SAa detects data read to the corresponding bit line BL, and determines whether the data is data "0" or data "1." Also, in a write operation, the sense amplifier section SAa applies a voltage to the bit line BL based on write data. Namely, in a write operation, the sense amplifier section SAa controls a voltage of the bit line BL in accordance with the data held in the data latch circuit SDL.

The data latch circuits SDL, ADL, BDL, and CDL temporarily store data. The data latch circuit SDL temporarily stores the read data detected by the sense amplifier section SAa. Also, the data latch circuit SDL temporarily stores write data in the write operation.

The data latch circuits ADL, BDL, and CDL are used for a multi-level operation in which the memory cell transistor MT stores data of two or more bits. Namely, the data latch circuit ADL is used to store the lower page. The data latch circuit BDL is used to store the middle page. The data latch circuit CDL is used to store the upper page. The number of data latch circuits included in the sense amplifier SA may be changed discretionarily in accordance with the number of bits stored in a single memory cell transistor MT.

Next, a circuit configuration of the sense amplifier SA in the sense amplifier unit 19A will be described. The sense amplifier SA includes the sense amplifier section SAa and the data latch circuits SDL, ADL, BDL, and CDL, as described above; however, circuit configurations of the sense amplifier section SAa and the data latch circuit SDL will be described below as circuit examples for performing a read operation.

Figure 8:
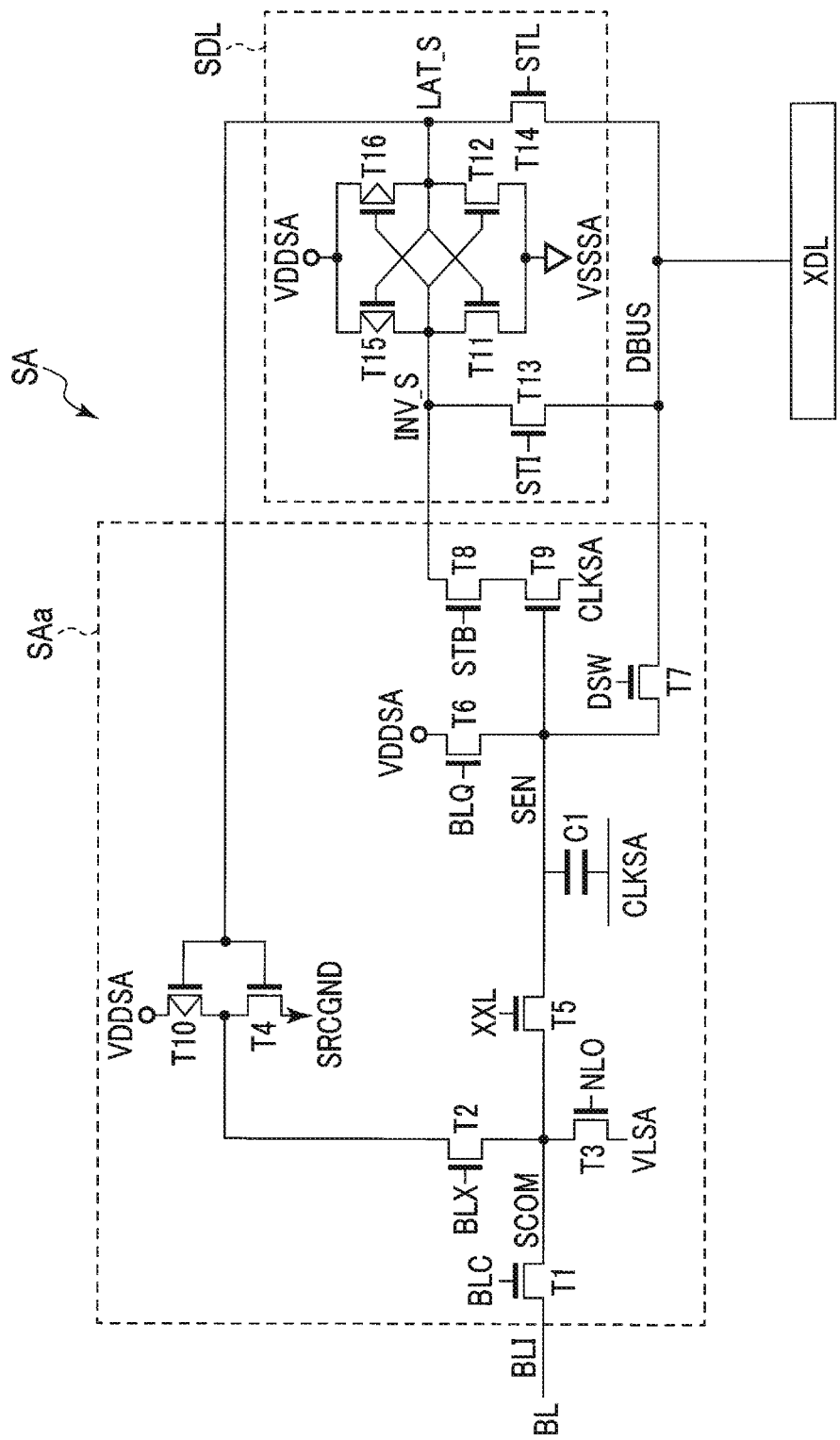
FIG. 8 is a circuit diagram of a sense amplifier section and a data latch circuit in the sense amplifier according to the first embodiment.

FIG. 8 is a circuit diagram of the sense amplifier section SAa and the data latch circuit SDL in the sense amplifier SA according to the first embodiment. In the descriptions provided below, one of a source or a drain of a transistor is referred to as "a first terminal of a current path," and the other of said source or drain is referred to as "a second terminal of a current path."

The sense amplifier SA includes the sense amplifier section SAa and the data latch circuit SDL. The sense amplifier section SAa includes n-channel MOS field-effect transistors (hereinafter referred to as "nMOS transistors") T1 to T9, a p-channel MOS field-effect transistor (hereinafter referred to as "pMOS transistor") T10, and a capacitor C1. The data latch circuit SDL includes nMOS transistors T11 to T14 and pMOS transistors T15 and T16.

The first terminal of the current path of the nMOS transistor T1 is connected to the bit line BL via a node BL1. The second terminal of the current path of the nMOS transistor T1 is connected to the first terminal of the current path of the nMOS transistor T5 via a node SCOM. A signal BLC is supplied to the gate of the nMOS transistor T1. Also, a signal XXL is supplied to the gate of the nMOS transistor T5.

The first terminal of the current path of the nMOS transistor T2 is connected to the node SCOM. The second terminal of the current path of the nMOS transistor T2 is connected to the first terminal of the current path of the nMOS transistor T4, and to the first terminal of the current path of the pMOS transistor T10. A voltage SRCGND (e.g., 0 V) is supplied to the second terminal of the current path of the nMOS transistor T4. A voltage VDDSA is supplied to the second terminal of the current path of the pMOS transistor T10. Furthermore, a signal BLX is supplied to the gate of the nMOS transistor T2.

The gates of the nMOS transistor T4 and the pMOS transistor T10 are connected to a node LAT_S. The nMOS transistor T4 and the pMOS transistor T10 form an inverter. This inverter functions as a driver that charges the bit line BL, or performs discharge or charge to decrease or increase the voltage of the data bus DBUS and the data latch circuits XDL. An example in which the gates of the nMOS transistor T4 and the pMOS transistor T10 are connected to the node LAT_S is described herein; however, if the gates of the nMOS transistor T4 and the pMOS transistor T10 are configured to be connected to a node INV_S, the data held in the node LAT_S can be transferred.

The first terminal of the current path of the nMOS transistor T3 is connected to the node SCOM. A voltage VLSA is supplied to the second terminal of the current path of the nMOS transistor T3. A signal NLO is supplied to the gate of the nMOS transistor T3.

The second terminal of the current path of the nMOS transistor T5 is connected to the gate of the nMOS transistor T9 via a node SEN. A first electrode of the capacitor C1 is connected to the node SEN, and a signal CLKSA is supplied to a second electrode of the capacitor C1.

The first terminal of the current path of the nMOS transistor T7 is connected to the node SEN. The data bus DEUS is connected to the second terminal of the current path of the nMOS transistor T7. A signal DSW is supplied to the gate of the nMOS transistor T7.

The first terminal of the current path of the nMOS transistor T6 is connected to the node SEN. The voltage VDDSA is supplied to the second terminal of the current path of the nMOS transistor T6. A signal BLQ is supplied to the gate of the nMOS transistor T6.

The first terminal of the current path of the nMOS transistor T9 is connected to the first terminal of the current path of the nMOS transistor T8, and the second terminal of the current path of the nMOS transistor T8 is connected to the node INV_S. The signal CLKSA is supplied to the second terminal of the current path of the nMOS transistor T9. Also, a strobe signal STB is supplied to the gate of the nMOS transistor T8.

The node INV_S is connected to the first terminal of the current path of the nMOS transistor T11 and to the first terminal of the current path of the pMOS transistor T15, and also to the gate of the nMOS transistor T12 and the gate of the pMOS transistor T16. The first terminal of the current path of the nMOS transistor T12 and the first terminal of the current path of the pMOS transistor T16 are connected to the node LAT_S. The node LAT_S is connected to the gate of the nMOS transistor T1l and the gate of the pMOS transistor T15.

The voltage VDDSA is supplied to the second terminals of the current paths of the pMOS transistors T15 and T16. A voltage VSSSA (e.g., 0 V) is supplied to the second terminals of the current paths of the nMOS transistors T11 and T12. The nMOS transistor T11 and the pMOS transistor T15 form an inverter, and the nMOS transistor T12 and the pMOS transistor T16 also form an inverter.

The first terminal of the current path of the nMOS transistor T13 is connected to the node INV_S, and the second terminal of the current path of the nMOS transistor T13 is connected to the data bus DBUS. A signal ST1 is supplied to the gate of the nMOS transistor T13.

The first terminal of the current path of the nMOS transistor T14 is connected to the node LAT_S, and the second terminal of the current path of the nMOS transistor T14 is connected to the data bus DBUS. A signal STL is supplied to the gate of the nMOS transistor T14.

The data latch circuit XDL is connected to the data bus DBUS.

1.3. Read Operation

Next, a read operation performed by the sense amplifier unit 19A will be described. Specifically, an operation of reading data stored in the memory cell transistor MT to the data latch circuit XDL, via the data latch circuit SDL, will be described.

1.3.1. Read from Memory Cell Transistor MT to Data Latch Circuit SDL

Figure 9:
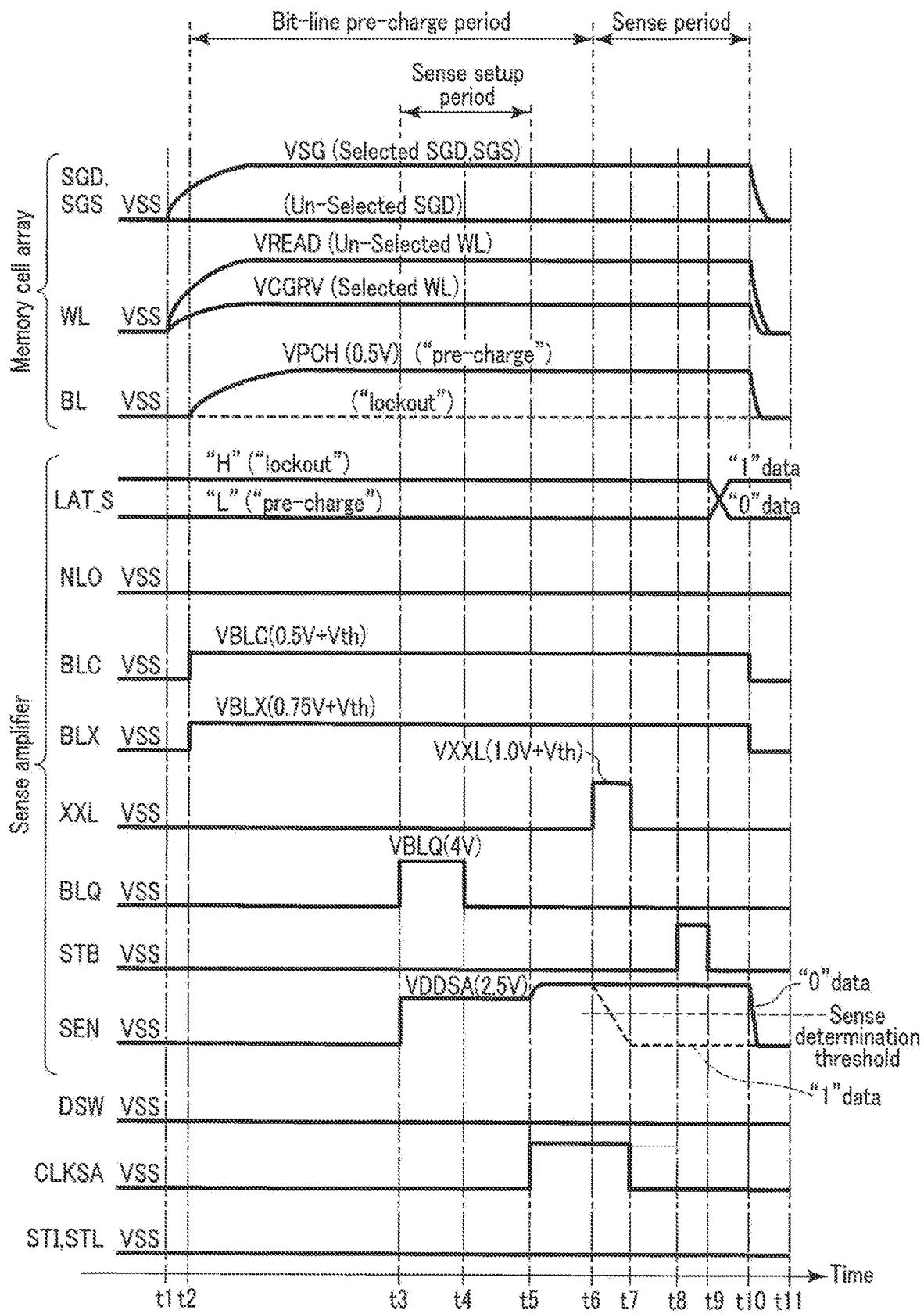
FIG. 9 is a timing chart showing a voltage of a control signal in a read operation of the first embodiment.

FIG. 9 is a timing chart showing voltages of control signals in the operation of reading from the memory cell transistor MT to the data latch circuit SDL. The sequencer 15 controls the control signals, such as the signals NLO, BLC, BLX, XXL, BLQ, STB, DSW, CLKSA, ST1, and STL, which control the read operation, and transmits said signals to the memory cell array 11 and the sense amplifier SA.

The read operation includes a bit line pre-charge period (including a sense setup period) and a sense period. The bit line pre-charge period is a period in which a voltage VPCH is applied to a selected bit line BL before data is sensed from a read-targeted memory cell transistor. The sense setup period is included in this bit line pre-charge period. The sense setup period is a period in which the voltage of the node SEN is increased to a voltage equal to or greater than the voltage VDDSA prior to a sense period. The sense period is a period in which the voltage of the node SEN, generated when the read-targeted memory cell transistor is in the ON state (or the conducting state) or OFF state (or the non-conducting state), is detected by the sense amplifier section SAa. The data detected by the sense amplifier section SAa is held in the data latch circuit SDL.

At time t1 shown in FIG. 9, the row decoder 17 applies a voltage VSG to the select gate lines SGD and SGS corresponding to the read-targeted memory cell transistor MT. Thereby, the select transistors ST1 and ST2 are turned on. The row decoder 17 applies a voltage VCGRV to a selected word line WL, and applies the voltage VREAD to a non-selected word line WL. The voltage VCGRV is set in accordance with read data. The voltage VREAD turns on the memory cell transistor MT regardless of the threshold voltage of the memory cell transistor MT, and the relationship between the voltage VREAD and the voltage VCGRV is VREAD>VCGRV.

At time t2, the sequencer 15 brings the signal BLC and the signal BLX of the sense amplifier SA to an "H (high)" level. Namely, a voltage VBLC (e.g., 0.5 V+Vth) is applied to the gate of the nMOS transistor T1, so that the nMOS transistor T1 is turned on. A voltage Vth is a threshold voltage of a low-withstand-voltage nMOS transistor in the sense amplifier SA. Likewise, a voltage VBLX (e.g., 0.75 V+Vth) is applied to the nMOS transistor T2, so that the nMOS transistor T2 is turned on. The relationship between the voltage VBLX and the voltage VBLC is VBLX≥VBLC.

"0" data (e.g., "L (low)" level) is held in the data latch circuit SDL corresponding to a bit line connected to the read-targeted memory cell transistor MT. When "0" data is held in the data latch circuit SDL, the "L" level is held in the node LAT_S thereof. Therefore, the pMOS transistor T10 is turned on, the nMOS transistor T4 is turned off, and the voltage VDDSA is applied to the nMOS transistor T2. Thereby, a pre-charge voltage VPCH (e.g., 0.5 V) clamped by the nMOS transistor T1 is applied to the bit line BL ("pre-charge").

A cell current Icell passes from the bit line BL side to the source line SL side in accordance with a threshold voltage Vtc of the read-targeted memory cell transistor MT. Specifically, when the threshold voltage Vtc is lower than the voltage VCGRV, and the memory cell transistor MT is in the ON state, the cell current Icell passes through the corresponding sense amplifier SA. On the other hand, when the threshold voltage Vtc is higher than the voltage VCGRV, and the memory cell transistor MT is in the OFF state, said memory cell transistor MT is turned off, and the cell current Icell does not pass through the corresponding sense amplifier SA.

For example, "1" data (e.g., "H" level) is held in the data latch circuit SDL corresponding to a bit line connected to a memory cell transistor MT that is not a read-targeted memory cell transistor. When "1" data is held in the data latch circuit SDL, the "H" level is held in the node LAT_S thereof. Therefore, the nMOS transistor T4 is turned on, the pMOS transistor T10 is turned off, and the voltage SRCGND is supplied to the nMOS transistor T2. Thereby, the voltage VSS, for example, is applied to the bit line BL ("lockout").

At time t3, the sequencer 15 brings the signal BLQ to the "H" level. Specifically, a voltage VBLQ (e.g., 4V) is applied to the gate of the nMOS transistor T6, so that the nMOS transistor T6 is turned on. Thereby, the voltage VDDSA (e.g., 2.5 V) is applied to the node SEN.

After charging of the node SEN is completed, the sequencer 15, at time t4, brings the signal BLQ to the "L" level, so that the nMOS transistor T6 is turned off.

At time t5, the sequencer 15 brings the signal CLKSA to the "H" level. Thereby, potential of the node SEN is increased to a voltage higher than the voltage VDDSA.

At time t6, the sequencer 15 brings the signal XXL to the "H" level. Namely, the sequencer 15 applies a voltage VXXL (e.g., 1.0 V+Vtn) to the gate of the nMOS transistor T5, so that the nMOS transistor T5 is turned on. Thereby, in a sense amplifier SA targeted for a read operation, a voltage (e.g., 1 V) clamped by the nMOS transistor T5 is applied from the node SEN to the node SCOM. In a sense amplifier SA not targeted for a read operation, the node SEN is at the "L" level, and therefore no voltage is applied thereto.

At this time, in a sense amplifier SA targeted for a read operation (that is, in a sense amplifier SA corresponding to a selected bit line BL), the cell current Icell passes from the sense amplifier SA to the bit line BL when the read-targeted memory cell transistor MT is in the ON state. Therefore, the voltage of the node SEN greatly decreases. On the other hand, when the read-targeted memory cell transistor MT is in the OFF state, hardly any of the cell current Icell passes from the sense amplifier SA to the bit line BL. Therefore, the voltage of the node SEN hardly decreases.

At time t7, the sequencer 15 brings the signal XXL to the "L" level, so that the nMOS transistor T5 is turned off.

At time t8, the sequencer 15 brings the signal STB to the "H" level, so that the nMOS transistor T8 is turned on.

In a sense amplifier SA targeted for a read operation, the nMOS transistor T9 is turned off when the voltage of the node SEN is lower than a sense determination threshold, that is, the threshold voltage of the nMOS transistor T9. Therefore, the voltage of the node INV_S hardly decreases. As a result, the node INV_S stores "1" data ("H" level). On the other hand, when the voltage of the node SEN is higher than the sense determination threshold, the nMOS transistor T9 is turned on. Therefore, the voltage of the node INV_S greatly decreases. As a result, the node INV_S stores "0" data ("L" level). In a sense amplifier SA not targeted for a read operation, the node SEN is at the "L" level, and therefore the nMOS transistor T9 is turned off. Therefore, the node INV_S stores "1" data.

Namely, when the read-targeted memory cell transistor MT is in the ON state, the voltage of the node SEN decreases to a level which is lower than the sense determination threshold; and in this case, the voltage of the node INV_S is held at the "H" level. As a result, the data latch circuit SDL stores "1" data ("H" level). On the other hand, when the read-targeted memory cell transistor MT is in the OFF state, the voltage of the node SEN is kept higher than the sense determination threshold. In this case, the voltage of the node INV_S decreases to the "L" level. Therefore, the data latch circuit SDL stores "0" data ("L" level).

At time t9, the sequencer 15 brings the signal STE to the "L" level, so that the nMOS transistor T8 is turned off. In this manner, the sequencer 15 stores the data read from the read-targeted memory cell transistor MT in the data latch circuit DL.

At time t10 to time t11, a recovery operation is performed, and the operation of reading from the memory cell transistor MT to the data latch circuit SDL is ended.

1.3.2. Data Transfer from Data Latch Circuit DL to Data Latch Circuit XDL

Next, the read data stored in the data latch circuit SDL is transferred to the data latch circuit XDL via the data bus DBUS. An example in which the data latch circuit XDL stores the "H" level before receiving the read data will be described below; however, the data latch circuit XDL need not necessarily store the "H" level.

Figure 10:
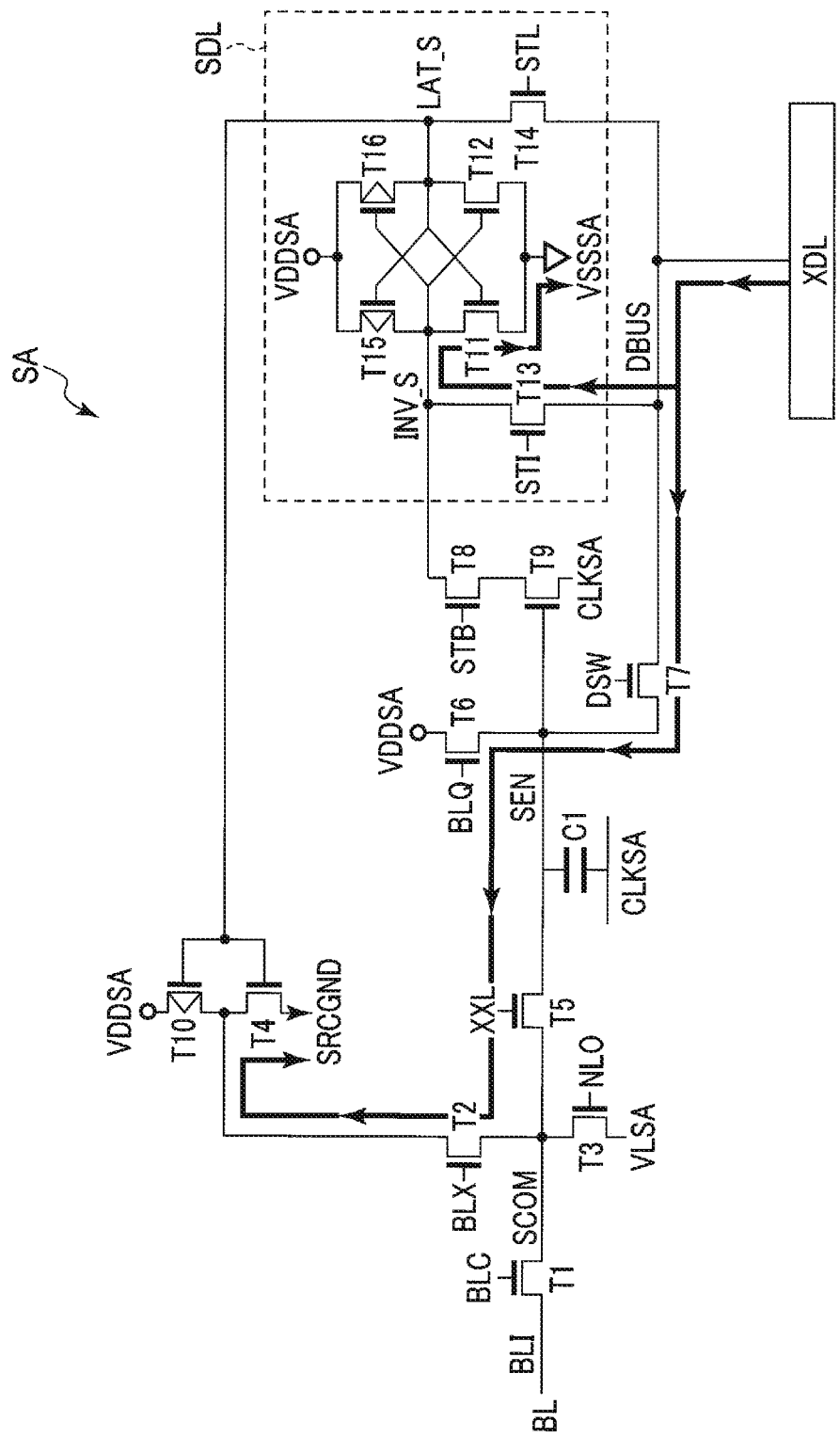
FIG. 10 shows a manner of data transfer from a data latch circuit SDL to a data latch circuit XDL according to the first embodiment.

FIGS. 10 and 11 are circuit diagrams showing a manner of data transfer from the data latch circuit SDL to the data latch circuit XDL. FIG. 10 shows an operation of transferring the "L" level held in the data latch circuit SDL to the data latch circuit XDL. FIG. 11 shows an operation of transferring the "H" level held in the data latch circuit SDL to the data latch circuit XDL.

Figure 12:
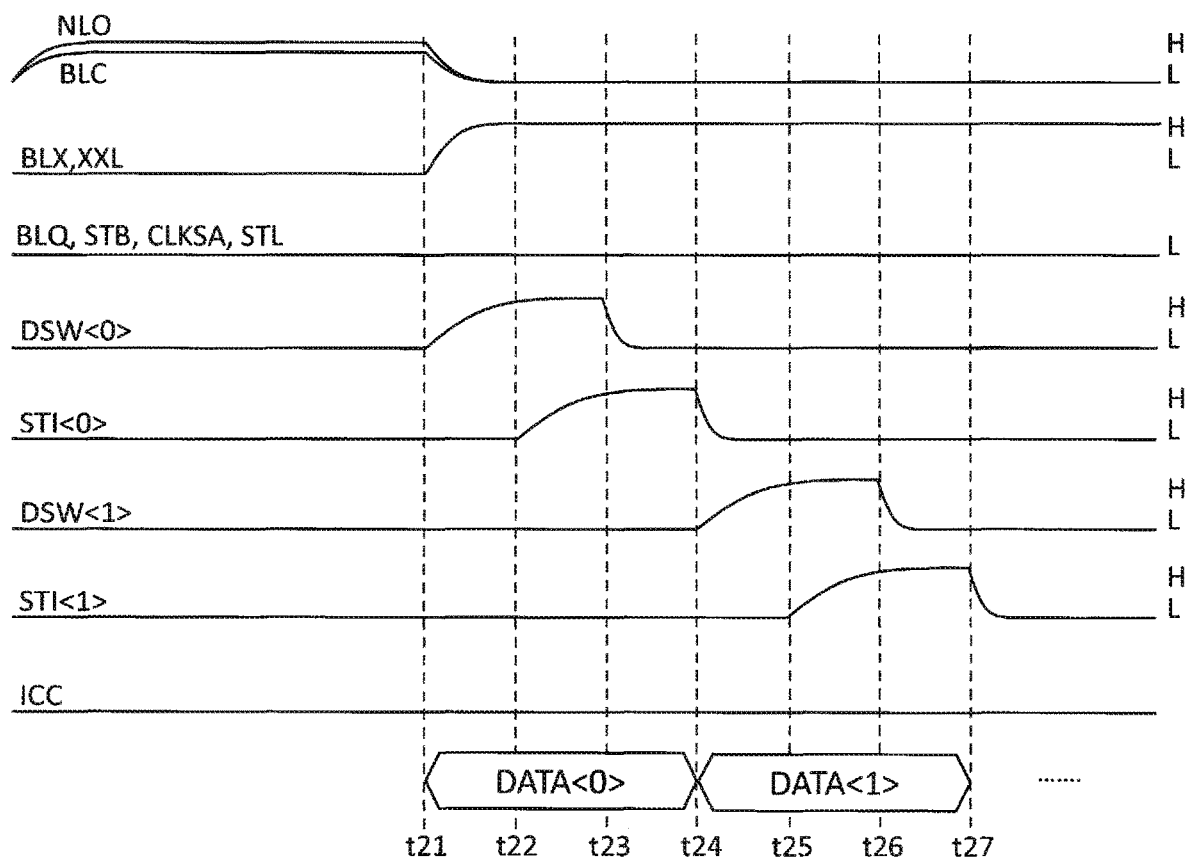
FIG. 12 is a timing chart of a control signal during data transfer from the data latch circuit SDL to the data latch circuit XDL according to the first embodiment.

FIG. 12 is a timing chart showing voltages of control signals, and a power supply current ICC during data transfer from the data latch circuit SDL to the data latch circuit XDL. The sequencer 15 controls control signals, such as the signals NLO, BLC, BLX, XXL, BLQ, STH, DSW, CLKSA, STI, and STL, which in turn control the data transfer operation, and transmits these signals to the sense amplifier SA. The power supply current ICC will be described later.

In the operation of transferring the "L" level held in the data latch circuit SDL (node INV_S) to the data latch circuit XDL, an operation of decreasing the "H" level held by the data latch circuit XDL through discharge is performed, as shown in FIG. 10. On the other hand, in the operation of transferring the "H" level held in the data latch circuit SDL (node INV_S), an operation of charging the data latch circuit XDL to an "H"-level voltage is performed, as shown in FIG. 11, so that the "H" level of the data latch circuit XDL is maintained. An operation of data transfer from the sense amplifier SA<0> to the data latch circuit XDL<0>, and subsequent data transfer from the sense amplifier SA<1> to the data latch circuit XDL<1>, will be described below as an example of the data transfer operation.

First of all, prior to time t21 shown in FIG. 12, the sequencer 15 brings the signals NLO and BLC to the "H" level, and brings the signals BLX, DSW<0>, XXL, and STI<0> to the "L" level. Furthermore, the voltages of the other signals except the voltage VDDSA are set to the "L" level.

At time t21, the sequencer 15 brings the signals NLO and BLC to the "L" level, and brings the signals BLX and XXL to the "H" level. As a result, the nMOS transistors T3 and T1 are set to the OFF state, and the nMOS transistors T2 and T5 are set to the ON state. Furthermore, the signal DSW<0> is brought to the "H" level. As a result, the nMOS transistor T7 is set to the ON state. The voltages of the other signals are maintained at existing levels.

At time t22, the sequencer 15 brings the signal STI<0> to the "H" level. As a result, the nMOS transistor T13 is set to the ON state.

When the data held in the data latch circuit SNL is at the "L" level (that is, when the node INV_S is at the "L" level), the nMOS transistor T11 is in the ON state, and the pMOS transistor T15 is in the OFF state. Thereby, the "H"-level voltage held by the data latch circuit XDL is decreased to the voltage VSSSA through discharge via the nMOS transistors T13 and T11.

At this time, since the node LAT_S is at the "H" level when the node INV_S is at the "L" level, the nMOS transistor T4 is in the ON state, and the pMOS transistor T10 is in the OFF state. Therefore, the "H"-level voltage of the data latch circuit XDL is decreased to the voltage SRCGND through discharge via the nMOS transistors T7, T5, T2, and T4, in parallel with the above-described discharge through the nMOS transistors T13 and T11.

On the other hand, when the data held in the data latch circuit SDL is at the "H" level (that is, when the node INV_S is at the "H" level), the node LAT_S is at the "L" level; therefore, the pMOS transistor T10 is in the ON state, and the nMOS transistor T4 is in the OFF state. Thereby, the data latch circuit XDL is charged to the voltage VDDSA supplied to the pMOS transistor T10 via the nMOS transistors T2, T5, and T7.

At this time, since the node LAT_S is at the "L" level, the pMOS transistor T15 is in the ON state, and the nMOS transistor T11 is in the OFF state. Therefore, the data latch circuit XDL is charged to the voltage VDDSA supplied to the pMOS transistor T15 via the nMOS transistor T13, in parallel with the above-described charging through the transistors T2, T5, and T7. If a pMOS transistor is provided between the pMOS transistor T15 and the node INV_S, for example, setting this pMOS transistor to the ON state causes the charging through the nMOS transistor T13 to be performed in a manner similar to the above description.

Thereafter, the sequencer 15 brings the signal DSW<0> to the "L" level at time t23, and further brings the signal STI<0> to the "L" level at time t24.

Through the above procedure, transfer of data <0> from the data latch circuit SDL<0> to the data latch circuit XDL<0> via the data bus DBUS ends.

Next, at time t24, transfer of data <1> from the data latch circuit SDL<1> to the data latch circuit XDL<1>, via the data bus DBUS, is started. This operation of transferring the data <1> is the same as the above-described operation of transferring the data <0>, except that the data is transferred from the data latch circuit SDL<1> to the data latch circuit XDL<1>.

More specifically, at time t24, the sequencer 15 brings the signal DSW<1> to the "H" level. Thereby, the transistor T7 is set to the ON state. The voltages of the other signals are maintained at existing levels.

At time t25, the sequencer 15 brings the signal STI<1> to the "H" level. Thereby, the nMOS transistor T13 is set to the ON state.

When the data held in the data latch circuit SDL is at the "L" level (the node INV_S is at the "L" level), the nMOS transistor T11 is in the ON state, and the pMOS transistor T15 is in the OFF state. Thereby, the "H"-level voltage held by the data latch circuit XDL is decreased to the voltage VSSSA through discharge via the nMOS transistors T13 and T11.

At this time, since the node LAT_S is at the "H" level when the node INV_S is at the "L" level, the nMOS transistor T4 is in the ON state, and the pMOS transistor T10 is in the OFF state. Therefore, the "H"-level voltage of the data latch circuit XDL is decreased to the voltage SRCGND through discharge via the nMOS transistors T7, T5, T2, and T4, in parallel with the above-described discharge through the nMOS transistors T13 and T11.

On the other hand, when the data held in the data latch circuit SDL is at the "H" level (the node INV_S is at the "H" level), the node LAT_S is at the "L" level; therefore, the pMOS transistor T10 is in the ON state, and the nMOS transistor T4 is in the OFF state. Thereby, the data latch circuit XDL is charged to the voltage VDDSA supplied to the pMOS transistor T10 via the nMOS transistors T2, T5, and T7.

At this time, since the node LAT_S is at the "L" level, the pMOS transistor T15 is in the ON state, and the nMOS transistor T11 is in the OFF state. Therefore, the data latch circuit XDL is charged to the voltage VDDSA supplied to the pMOS transistor T15 via the nMOS transistor T13, in parallel with the above-described charging through the transistors T2, T5, and T7. In a manner similar to the above description, if a pMOS transistor is provided between the pMOS transistor T15 and the node INV_S, for example, setting this pMOS transistor to the ON state causes the charging through the nMOS transistor T13 to be performed.

Next, the sequencer 15 brings the signal DSW<1> to the "L" level at time t26, and further brings the signal STI<1> to the "L" level at time t27.

Through the above procedure, transfer of data <1> from the data latch circuit SDL<1> to the data latch circuit XDL<1> via the data bus DBUS ends. Thereafter, transfer of data <2> to <15> is sequentially performed in a similar manner.

The example in which the data held in the node INV_S in the data latch circuit SDL is transferred is described above; however, if the gates of the nMOS transistor T4 and the pMOS transistor T10 are configured to be connected to the node INV_S, the data held in the node LAT_S can be transferred.

Also, the example in which transfer of the data <0> to <15> is sequentially performed in the configuration in which the sense amplifiers SA<0> to SA<15> are connected to one data bus DBUS is described; however, if the sense amplifiers SA<0> to SA<15> are respectively connected to 16 data buses DBUS, transfer of the data <0> to <15> can be performed in parallel (or simultaneously).

1.3.3. Current ICC During Data Transfer in Read Operation

The voltage VDDSA supplied to the sense amplifier SA corresponds to the power supply voltage VCC used in the semiconductor memory device 10. Namely, the voltage VDDSA is generated based on the power supply voltage VCC. When the above-described data transfer is performed, the voltage VDDSA is supplied to the sense amplifier SA. As a result, the power supply current ICC varies during the data transfer operation.

The power supply current ICC corresponds to, for example, a current flowing to a terminal that supplies the power supply voltage VCC to the semiconductor memory device 10, and can be regarded as a consumption current of the semiconductor memory device 10. The variation of the power supply current ICC during the data transfer operation will be described below.

FIGS. 13 to 17 show the magnitude of the power supply current ICC generated during the data transfer according to the first embodiment. More specifically, FIGS. 13 to 17 show the power supply current ICC generated mainly by the charge and discharge performed on the data bus DBUS. The initial state of the data bus DBUS has been set to the "L" level at the start of data transfer.

Figure 13:
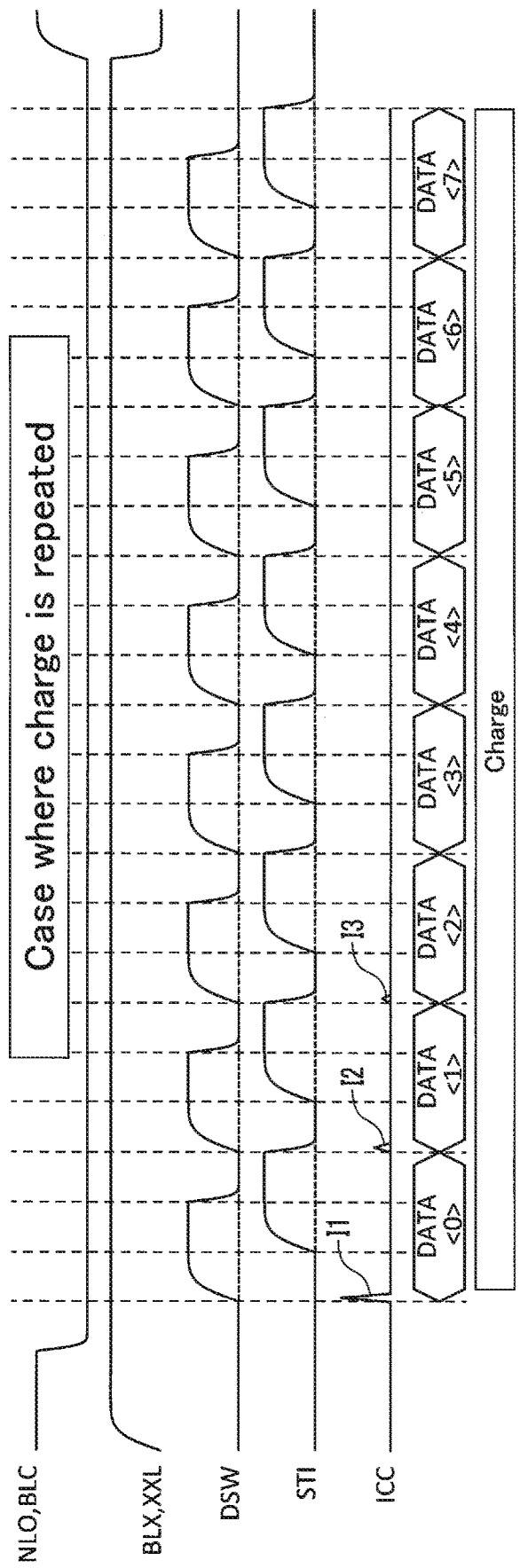
FIGS. 13 to 17 show a current ICC generated during data transfer according to the first embodiment.

FIG. 13 shows a case where the "H" level is repeatedly transferred; that is, a case where charge is repeatedly performed when the data <0> to the data <7> are transferred from the data latch circuit SDL to the data latch circuit XDL.

In a case of transferring the data <0> from the data latch circuit SDL<0> to the data latch circuit XDL<0>, the power supply current ICC changes to a current value I1 when the signal DSW rises to the "H" level. Next, in a case of transferring the data <1> from the data latch circuit SDL<1> to the data latch circuit XDL<1>, the power supply current ICC changes to a current value I2, which is smaller than the current value I1, when the signal DSW rises to the "H" level. Subsequently, in a case of transferring the data <2> from the data latch circuit SDL<2> to the data latch circuit XDL<2>, the power supply current ICC changes to a current value I3, which is smaller than the current value I2, when the signal DSW rises to the "H" level. In the subsequent data transfer, the change of the power supply current ICC further decreases.

Figure 14:
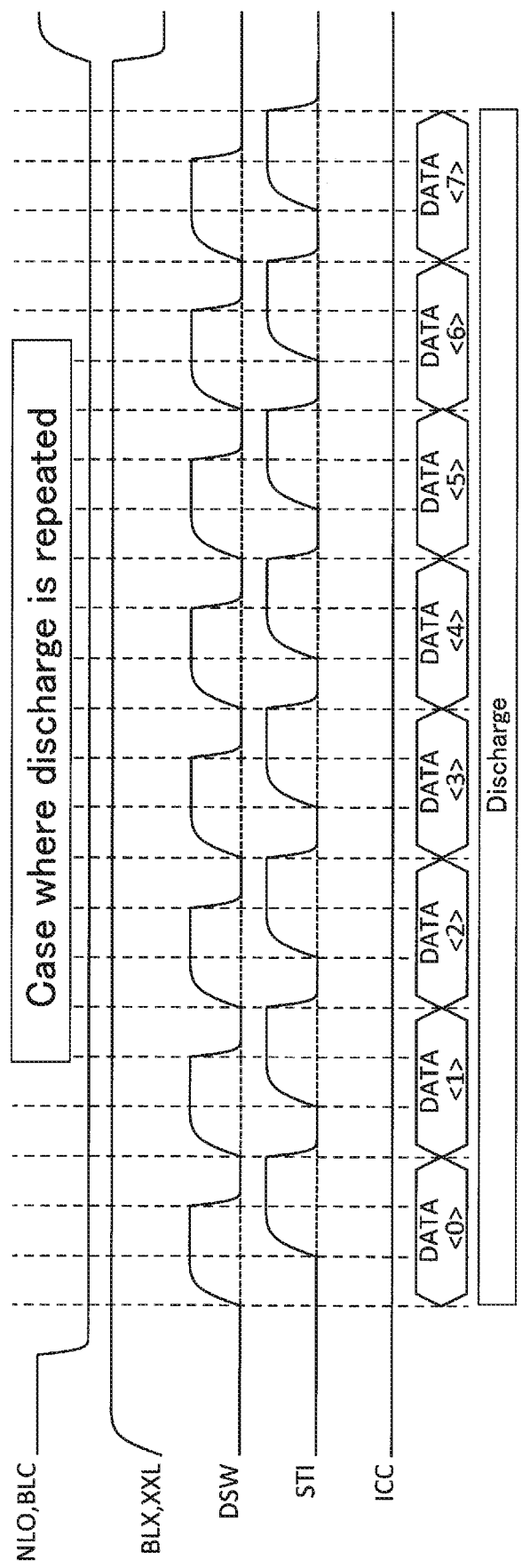

FIG. 14 shows a case where the "L" level is repeatedly transferred, that is, a case where discharge is repeatedly performed during data transfer from the data latch circuit SDL to the data latch circuit XDL. In this case, the power supply current ICC hardly changes because discharge is repeated.

Figure 15:
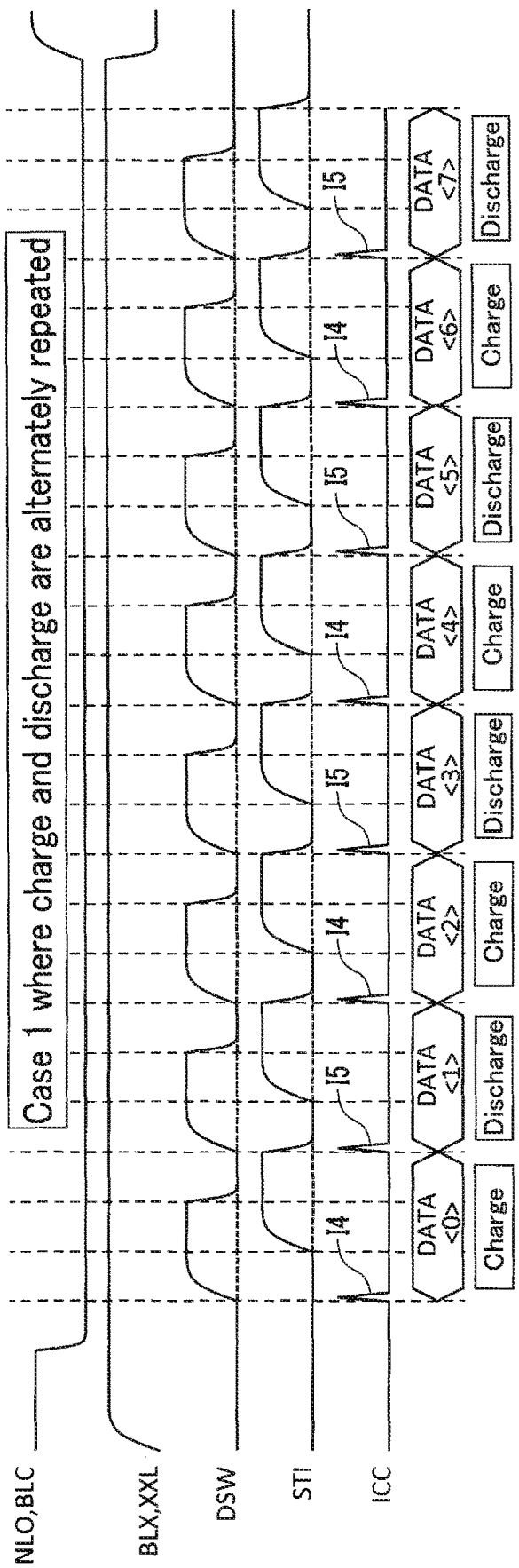
Figure 16:
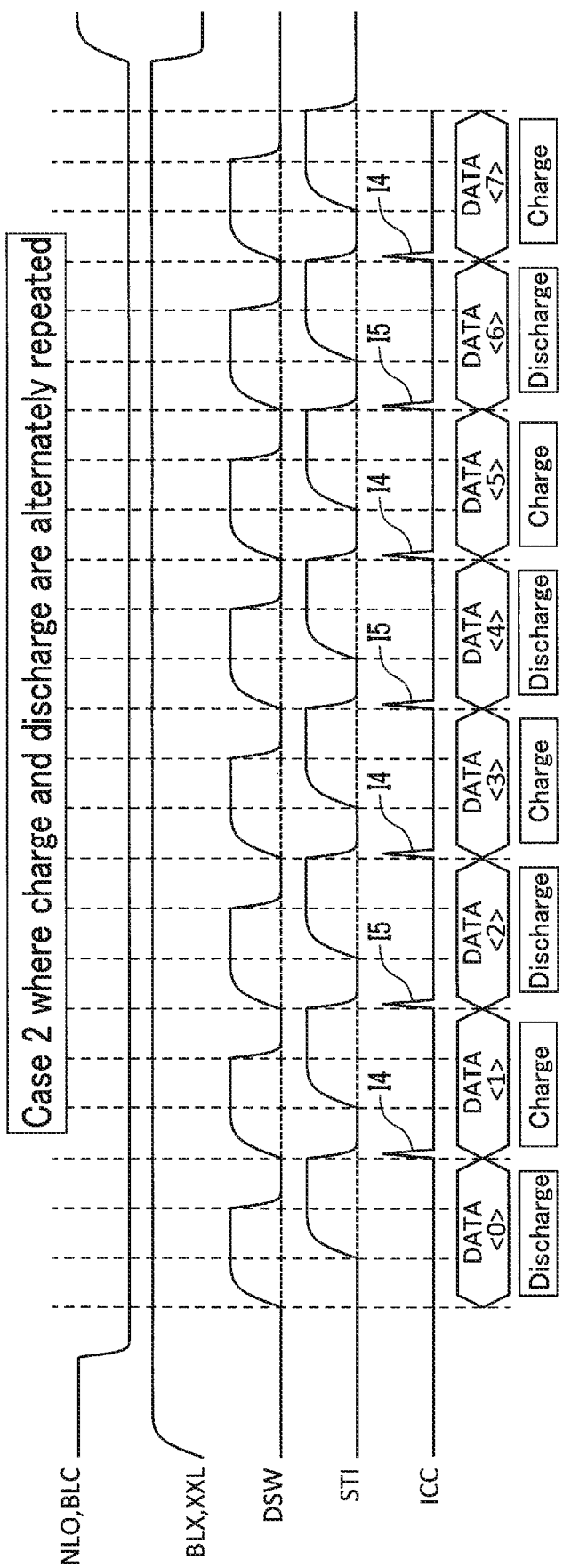

FIGS. 15 and 16 respectively show a case where the "H" level and the "L" level are alternately and repeatedly transferred; that is, a case where charge and discharge are alternately and repeatedly performed during data transfer from the data latch circuit SDL to the data latch circuit XDL.

In the example shown in FIG. 15, in the case of transferring the data <0> from the data latch circuit SDL<0> to the data latch circuit XDL<0> (in the case of charging), the data bus DBUS is charged when the signal DSW rises to the "H" level; therefore, the power supply current ICC changes to a current value I4. Next, in the case of transferring the data <1> (in the case of discharging), the discharge is performed on the data bus DBUS when the signal DSW rises to the "H" level; therefore, the power supply current ICC changes to a current value I5. Subsequently, in the case of transferring the data <2> (in the case of charging), the data bus DBUS is charged when the signal DSW rises to the "H" level; therefore, the power supply current ICC changes to the current value I4. During subsequent data transfer, discharge and charge are repeatedly performed; and at the time of charging, as with the time of transferring the data <0>, the power supply current ICC changes to the current value I4 when the signal DSW rises to the "H" level. On the other hand, the power supply current ICC changes to the current value I5 at the time of discharging.

Also, in the example shown in FIG. 16, in the case of transferring the data <0> (in the case of discharging), the data bus DBUS is at the "L" level in the initial state when the signal DSW rises to the "H" level; therefore, the power supply current ICC hardly changes. In the subsequent transfer of the data <1> and the subsequent data, the power supply current ICC changes to the current value I4 at the time of charging, and the power supply current ICC changes to the current value I5 at the time of discharging, in a manner similar to the example shown in FIG. 15.

Figure 17:
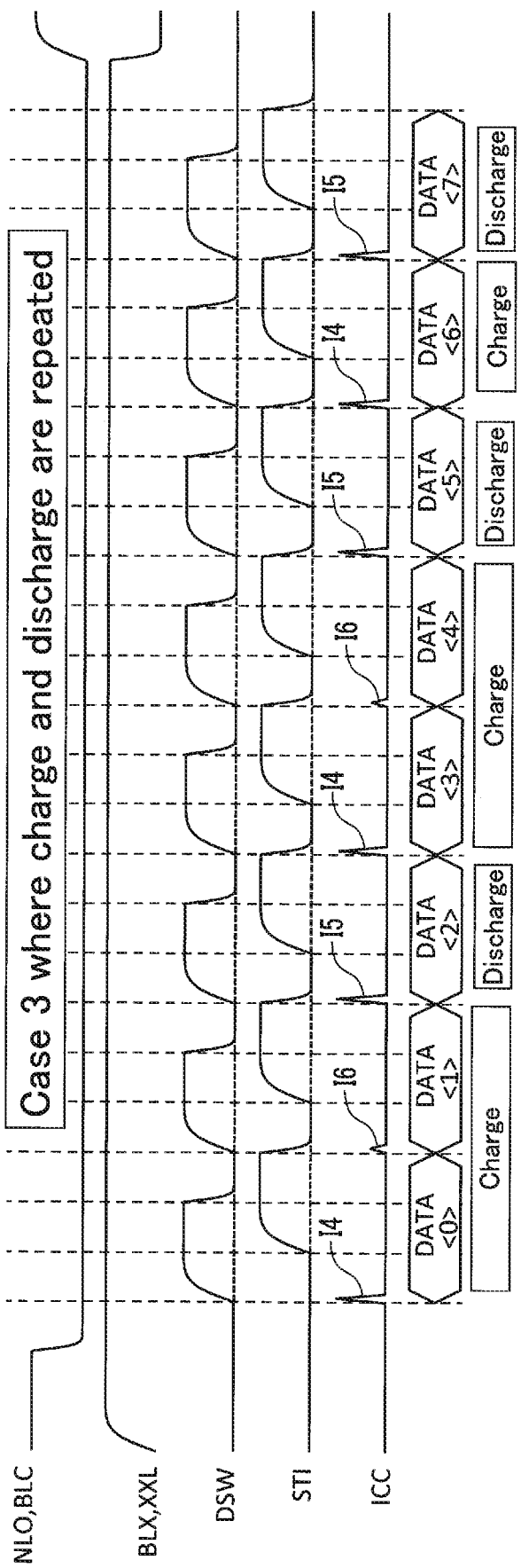

FIG. 17 shows a case where the "H" level and the "L" level are randomly transferred; that is, a case where charge and discharge are randomly performed during data transfer from the data latch circuit SDL to the data latch circuit XDL. In this example, in the case of transferring the data <0> (in the case of charging), the data bus DBUS is charged when the signal DSW rises to the "H" level; therefore, the power supply current ICC changes to the current value I4. Subsequently, in the transfer of the data <1>, charge is continuously performed; therefore, the power supply current ICC changes to a current value I6, which is smaller than the current value I4. In the subsequent transfer of the data <2> and the subsequent data, the power supply current ICC changes to the current value I4 at the time of charging, and the power supply current ICC changes to the current value I5 at the time of discharging, in a manner similar to the examples shown in FIGS. 15 and 16, When charge is continuously performed, the power supply current ICC changes to the current value I6, which is smaller than the current value I4.

Next, the variation of the power supply current ICC during the data transfer shown in FIG. 12 will be described with reference to FIG. 12. A case of transferring the "H" level (that is, a case of charging the data latch circuit XDL), will be described below.

At time t21, transfer of the data <0> is started. The sequencer 15 brings the signal DSW<0> to the "H" level, so that the nMOS transistor T7 is set to the ON state. Thereby, the data bus DBUS and the data latch circuit XDL are charged to the voltage VDDSA supplied to the pMOS transistor T10 via the nMOS transistors T2, T5, and T7. In this case, the power supply current ICC changes to the current value I1 when the signal DSW<0> rises to the "H" level.

Subsequently, transfer of the data <1> is started at time t24. The sequencer 15 brings the signal DSW<1> to the "H" level, so that the nMOS transistor T7 is set to the ON state. Thereby, the data bus DBUS and the data latch circuit XDL are charged to the voltage VDDSA supplied to the pMOS transistor T10 via the nMOS transistors T2, T5, and T7. In this case, the power supply current ICC changes to the current value I2, which is smaller than the current value I1, when the signal DSW<1> rises to the "H" level.

From the foregoing, characteristics of the power supply current ICC during the data transfer according to the first embodiment are as follows.

In the first embodiment, the variation of the current value of the power supply current ICC is smaller in the case when charging is repeated during the data transfer than when discharging is performed between charging. If charging is performed first, the amount of electrical charge necessary for charging is small in regard to the second and subsequent charging; therefore, the variation of the current value of the power supply current ICC is small. If discharge is repeatedly performed during the data transfer, charge and discharge are not performed on the data bus DBUS; therefore, the current value of the power supply current ICC hardly changes.

1.4. Advantageous Effects of First Embodiment

According to the first embodiment, a semiconductor memory device capable of accelerating a read operation can be provided.

Figure 18:
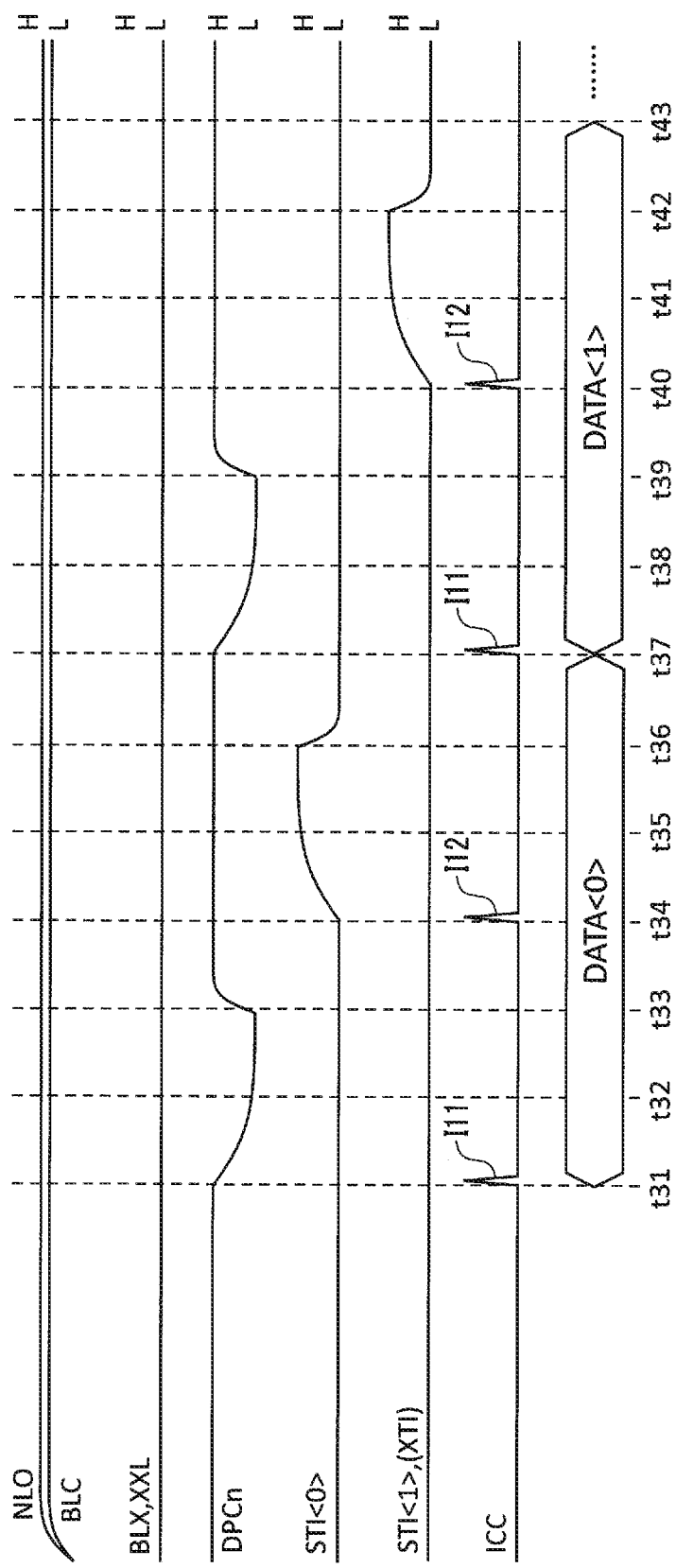
FIG. 18 is a timing chart showing a voltage of a control signal during data transfer of a comparative example.

A comparative example in relation to the first embodiment will be described first, and advantageous effects of the first embodiment will then be detailed. FIG. 18 is a timing chart showing voltages of control signals during data transfer of the comparative example. In the comparative example, when data transfer from the data latch circuit SDL to the data latch circuit. XDL is performed, whether the "L" level or the "H" level is transferred, the data bus DBUS is charged to the "H" level first by using a transistor for charging the data bus DBUS or using a signal DPCn for controlling this transistor, and then discharge is performed on the data latch circuit XDL ("L"-level transfer) or the "H" level is maintained ("H"-level transfer).

Specifically, the data bus DBUS is charged in a period in which the signal DPCn is at the "L" level at time t31 to time t33, and then discharge is performed on the data latch circuit XDL or the "H" level is maintained in a period in which the signal STI<0> is at the "H" level at time t33 to time t37, as shown in FIG. 18. Namely, at time t31 to t37, the data <0> is transferred from the data latch circuit SDL to the data latch circuit XDL.

Next, the data bus DBUS is charged in a period in which the signal DPCn is at the "L" level at time t37 to time t39, and then discharge is performed on the data latch circuit XDL or the "H" level is maintained in a period in which the signal STI<1> is at the "H" level at time t39 to time t43. Namely, at time t37 to time t43, the data <1> is transferred from the data latch circuit SDL to the data latch circuit XDL.

In the comparative example, when data transfer from the data latch circuit SDL to the data latch circuit XDL is performed, two operations, namely, performing charge on the data bus DBUS and performing discharge on the data latch circuit XDL or maintaining the "H" level, need be performed.

In the first embodiment, data can be transferred from the data latch circuit SDL to the data latch circuit XDL; that is, discharge or charge can be performed on the data latch circuit XDL (and data bus DBUS) without performing the operation of charging the data bus DBUS first on each occasion that data transfer is performed. As a result, the operation of charging the data bus DBUS can be omitted, allowing for reduction of the time required for the data transfer from the data latch circuit SDL to the data latch circuit XDL. Therefore, according to the first embodiment, the time for the data transfer between the data latch circuits can be reduced, thereby allowing for acceleration of the read operation.

Also, in the first embodiment, when discharge or charge is performed on the data bus DBUS and the data latch circuit XDL, a driver for pre-charging the bit line BL is used to perform discharge or charge on the data bus DBUS and the data latch circuit XDL. As a result, discharge or charge can be performed on the data bus DBUS and the data latch circuit XDL without increasing the number of circuit elements.

Also, the comparative example shows a case in which the operation of charging the data bus DBUS is performed every time data transfer occurs; therefore, the power supply current ICC varies at the time of transferring the data <0> and the data <1>. For example, when the transfer of the data <0> and the transfer of the data <1> are performed at different voltage levels, or when both the transfer of the data <0> and the transfer of the data <1> are performed at the "L" level, the power supply current ICC changes to a current value I11 at time t31 and time t37, and changes to a current value I12 at time t34 and time t40, as shown in FIG. 18.

On the other hand, in the first embodiment, when both the transfer of the data <0> and the transfer of the data <1> are performed at the "L" level, the power supply current ICC hardly changes, as shown in FIG. 12. Therefore, in the first embodiment, the power supply current ICC can be reduced. Namely, current consumption can be reduced.

In the first embodiment, the example in which data is transferred from the data latch circuit SDL to the data latch circuit XDL is described; however, it can also be applied to a case where data is transferred from the data latch circuit ADL, BDL, or CDL to the data latch circuit XDL.

2. Second Embodiment

Next, a semiconductor memory device according to a second embodiment will be described. In the second embodiment, an example in which a circuit capable of charging the data bus DBUS to the "H" level is used as the sense amplifier SA included in the sense amplifier unit 19A. The configurations other than that of the sense amplifier SA are the same as those of the first embodiment described above.

2.1. Configuration of Sense Amplifier SA

FIG. 19 is a circuit diagram of the sense amplifier section SAa, and the data latch circuit SDL in the sense amplifier SA, according to the second embodiment.

The sense amplifier SA of the second embodiment has the configuration shown in FIG. 8, to which a pMOS transistor T17 and an nMOS transistor T18 are added. A signal DPCn is supplied to the gate of the pMOS transistor T17. A signal XTI is supplied to the gate of the nMOS transistor T18. The sequencer 15 controls the signals DPCn and XTI, and transmits these signals to the sense amplifier SA.

The pMOS transistor T17 charges the data bus DBUS to the "H" level. The nMOS transistor T18 switches the state of the data bus DBUS and the data latch circuit XDL between a connected state and a cutoff state.

2.2. Read Operation

Next, a read operation performed by the sense amplifier unit 19A of the second embodiment will be described.

2.2.1. Read from Memory Cell Transistor MT to Data Latch Circuit SDL

In an operation of reading data stored in the memory cell transistor MT to the data latch circuit SDL, the sequencer 15 brings the signal DPCn to the "H" level and brings the signal XTI to the "L" level. Thereby, the signals DPCn and XTI are turned off. The other signals are the same as those described in the first embodiment.

2.2.2. Data Transfer from Data Latch Circuit SDL to Data Latch Circuit XDL

Figure 20:
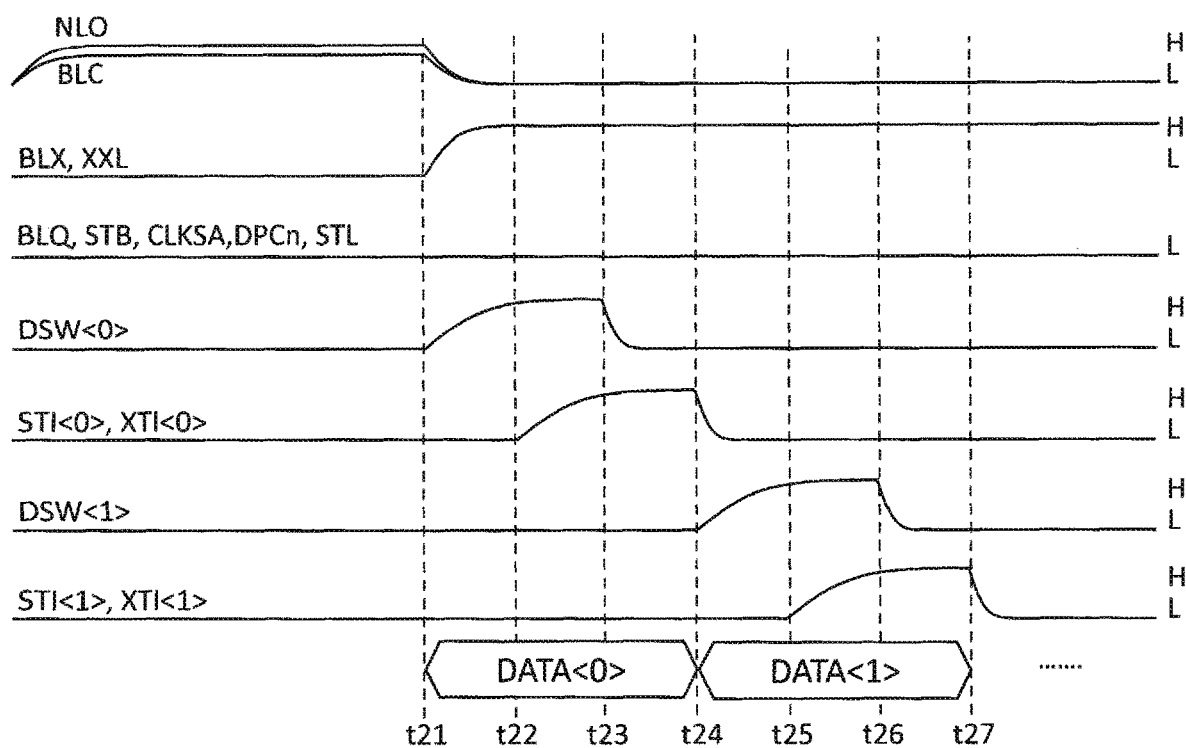
FIG. 20 is a timing chart of a control signal during data transfer from the data latch circuit SDL to the data latch circuit XDL according to the second embodiment.

FIG. 20 is a timing chart showing voltages of control signals during data transfer from the data latch circuit SDL to the data latch circuit XDL according to the second embodiment. The sequencer 15 controls control signals, such as the signals NLO, BLC, BLX, XXL, BLQ, STB, DSW, CLKSA, STI, STL, DPCn, and XTI, which in turn control the data transfer operation, and transmits these signals to the sense amplifier SA.

First of all, prior to time t21 shown in FIG. 20, the sequencer 15 brings the signals NLO and BLC to the "H" level, and brings the signals BLX, XXL, DSW<0>, STI<0>, and DPCn to the "L" level. Furthermore, the voltages of the other signals except the voltage VDDSA are set to the "L" level.

At time t21, the sequencer 15 brings the signals NLO and BLC to the "L" level, and brings the signals BLX and XXL to the "H" level. As a result, the nMOS transistors T3 and T1 are set to the OFF state, and the nMOS transistors T2 and T5 are set to the ON state. Furthermore, the signal DSW<0> is set to the "H" level. As a result, the nMOS transistor T7 is set to the ON state. The voltages of the other signals are maintained at existing levels.

At time t22, the sequencer 15 brings the signals STI<0> and XTI<0> to the "H" level. As a result, the nMOS transistors T13 and T18 are set to the ON state.

When the data held in the data latch circuit SDL is at the "L" level (that is, when the node INV_S is at the "L" level), the nMOS transistor T11 is in the ON state, and the pMOS transistor T15 is in the OFF state. Thereby, the "H"-level voltage held by the data latch circuit XDL is decreased to the voltage VSSSA through discharge via the nMOS transistors T18, T13, and T11.

At this time, since the node LAT_S is at the "H" level when the node INV_S is at the "L" level, the nMOS transistor T4 is in the ON state, and the pMOS transistor T10 is in the OFF state. Therefore, the "H"-level voltage of the data latch circuit XDL is decreased to the voltage SECOND through discharge via the nMOS transistors T18, T7, T5, T2, and T4, in parallel with the above-described discharge through the nMOS transistors T18, T13, and T11.

On the other hand, when the data held in the data latch circuit SDL is at the "H" level (that is, when the node INV_S is at the "H" level), the node LAT_S is at the "L" level; therefore, the pMOS transistor T10 is in the ON state, and the nMOS transistor T4 is in the OFF state. Thereby, the data latch circuit XDL is charged to the voltage VDDSA supplied to the pMOS transistor T10 via the nMOS transistors T2, T5, T7, and T18.

At this time, since the node LAT_S is at the "L" level, the pMOS transistor T15 is in the ON state, and the nMOS transistor T11 is in the OFF state. Therefore, the data latch circuit XDL is charged to the voltage VDDSA supplied to the pMOS transistor T15 via the nMOS transistors T13 and T18, in parallel with the above-described charging through the transistors T2, T5, T7, and T18.

Thereafter, the sequencer 15 brings the signal DSW<0> to the "L" level at time t23, and further brings the signals STI<0> and XTI<0> to the "L" level at time t24.

Through the above procedure, transfer of data <0> from the data latch circuit SDL<0> to the data latch circuit XDL<0>, via the data bus DBUS, ends.

Next, at time t24, transfer of data <1> from the data latch circuit SDL<1> to the data latch circuit XDL<1>, via the data bus DBUS, is started. This operation of transferring the data <1> is the same as the above-described operation of transferring the data <0>, except that the data is transferred from the data latch circuit SDL<1> to the data latch circuit XDL<1>.

More specifically, at time t24, the sequencer 15 brings the signal DSW<1> to the "H" level. As a result, the nMOS transistor T7 is set to the ON state. The voltages of the other signals are maintained at existing levels.

At time t25, the sequencer 15 brings the signals STI<1> and XTI<1> to the "H" level. As a result, the nMOS transistors T13 and T18 are set to the ON state.

When the data held in the data latch circuit SDL is at the "L" level (the node INV_S is at the "L" level), the nMOS transistor T11 is in the ON state, and the pMOS transistor T15 is in the OFF state. Thereby, the "H"-level voltage held by the data latch circuit XDL is decreased to the voltage VSSSA through discharge via the nMOS transistors T18, T13, and T11.

At this time, since the node LAT_S is at the "H" level when the node INV_S is at the "L" level, the nMOS transistor T4 is in the ON state, and the pMOS transistor T10 is in the OFF state. Therefore, the "H"-level voltage of the data latch circuit XDL is decreased to the voltage SRCGND through discharge via the nMOS transistors T18, T7, T5, T2, and T4, in parallel with the above-described discharge through the nMOS transistors T18, T13, and T11.

On the other hand, when the data held in the data latch circuit SDL is at the "H" level (the node INV_S is at the "H" level), the node LAT_S is at the "L" level; therefore, the pMOS transistor T10 is in the ON state, and the nMOS transistor T4 is in the OFF state. Thereby, the data latch circuit XDL is charged to the voltage VDDSA supplied to the pMOS transistor T10 via the nMOS transistors T2, T5, T7, and T18.

At this time, since the node LAT_S is at the "L" level, the pMOS transistor T15 is in the ON state, and the nMOS transistor T11 is in the OFF state. Therefore, the data latch circuit XDL is charged to the voltage VDDSA supplied to the pMOS transistor T15 via the nMOS transistors T13 and T18, in parallel with the above-described charging through the transistors T2, T5, T7, and T18.

Next, the sequencer 15 brings the signal DSW<1> to the "L" level at time t26, and further brings the signals STI<1> and XTI<1> to the "L" level at time t27.

Through the above procedure, the transfer of the data <1> from the data latch circuit SDL<1> to the data latch circuit XDL<1>, via the data bus DBUS, ends.

Thereafter, transfer of data <2> to <15> is sequentially performed in a similar manner.

2.2.3. Current ICC During Data Transfer in Read Operation

Next, the variation of the power supply current ICC during the data transfer operation according to the second embodiment will be described. FIGS. 21 to 25 show the magnitude of the power supply current ICC generated during the data transfer according to the second embodiment. More specifically, FIGS. 21 to 25 show the power supply current ICC generated mainly by performing the charge and discharge on the data bus DBUS, and decreasing the voltage of the data latch circuit XDL through discharge. The initial state of the data bus DBUS has been set to the "L" level at the start of data transfer, and the initial state of the data latch circuit XDL stores the "H" level.

Figure 21:
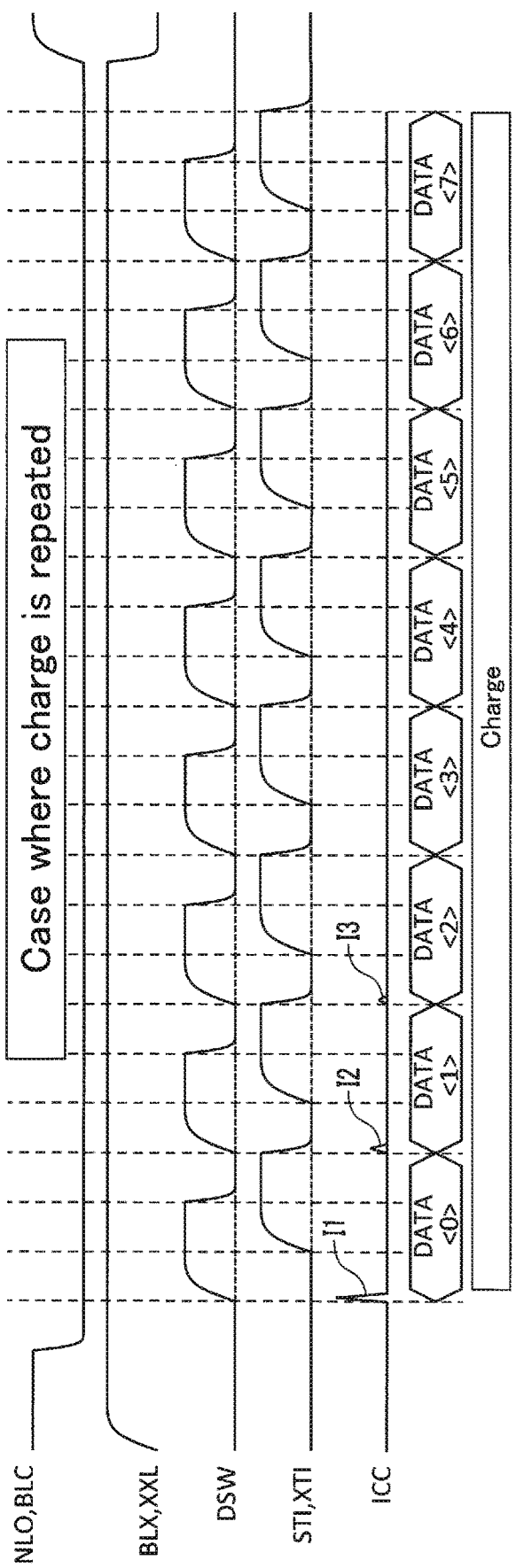
FIGS. 21 to 25 show a current ICC generated during data transfer according to the second embodiment.

FIG. 21 shows a case where the "H" level is repeatedly transferred; that is, a case where charge is repeatedly performed when the data <0> to the data <7> are transferred from the data latch circuit SDL to the data latch circuit XDL.

In the case of transferring the data <0>, the power supply current ICC changes to the current value I1 when the signal DSW rises to the "H" level. Next, in the case of transferring the data <1>, the power supply current ICC changes to the current value I2, which is smaller than the current value I1, when the signal DSW rises to the "H" level. Subsequently, in the case of transferring the data <2>, the power supply current ICC changes to the current value I3, which is smaller than the current value I2, when the signal DSW rises to the "H" level. In the subsequent data transfer, the change of the power supply current ICC further decreases.

Figure 22:
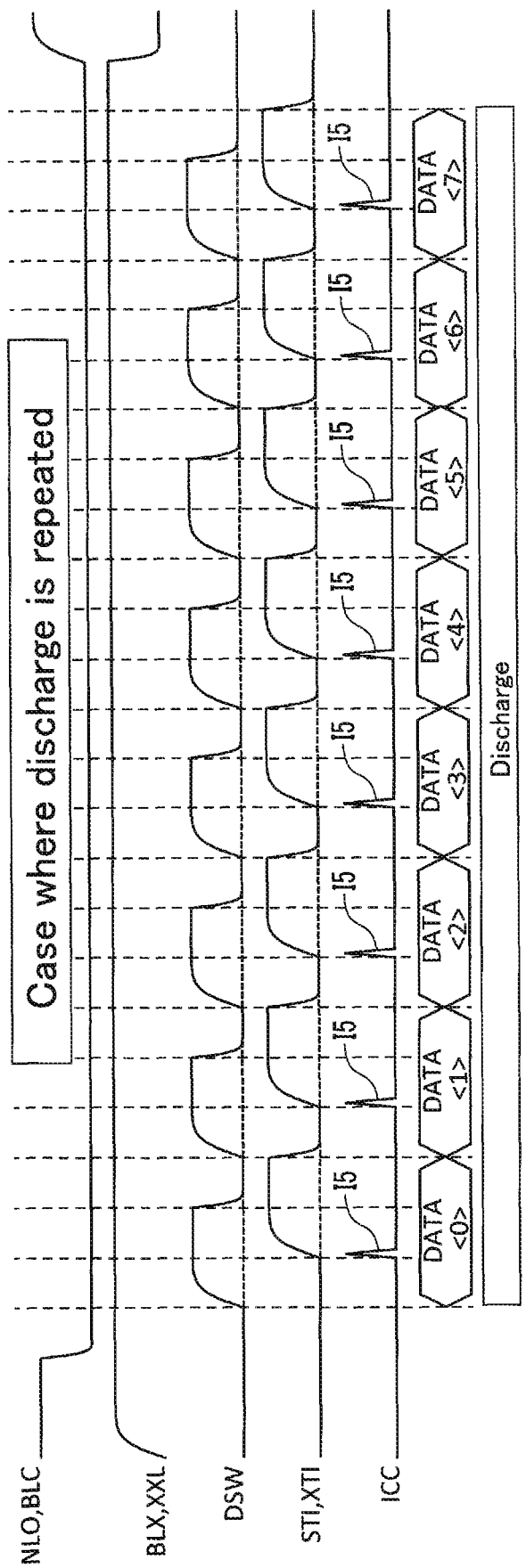

FIG. 22 shows a case where the "L" level is repeatedly transferred, that is, a case where discharge is repeatedly performed when the data is transferred from the data latch circuit SDL to the data latch circuit XDL.

In the case of transferring the data <0>, the power supply current ICC changes to the current value I5 when the signals STI and XTI rise to the "H" level. Next, in the case of transferring the data <1>, the power supply current ICC changes to the current value I5 when the signals STI and XTI rise to the "H" level. In the subsequent data transfer as well, the power supply current ICC changes to the current value I5 when the signals STI and XTI rise to the "H" level.

Figure 23:
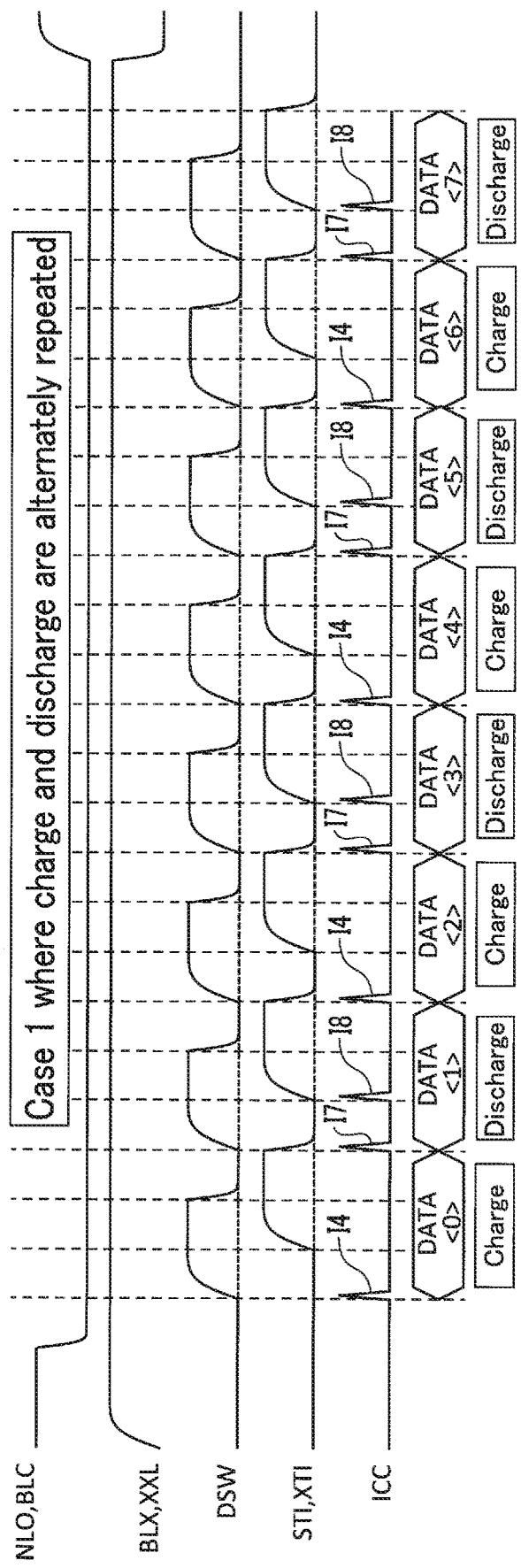
Figure 24:
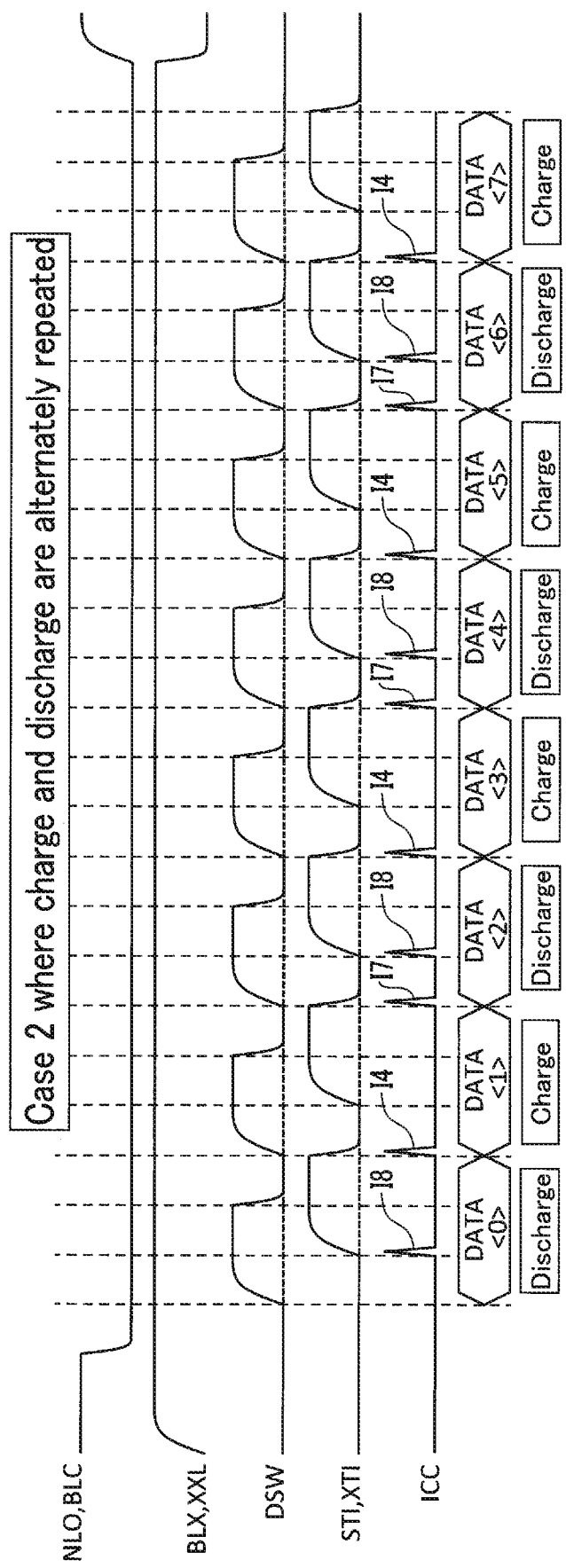

FIGS. 23 and 24 respectively show a case where the "H" level and the "L" level are alternately and repeatedly transferred; that is, a case where charge and discharge are alternately and repeatedly performed during the data transfer from the data latch circuit SDL to the data latch circuit XDL.

In the example shown in FIG. 23, in the case of transferring the data <0> (in the case of charging), the data bus DBUS is charged when the signal DSW rises to the "H" level; therefore, the power supply current ICC changes to the current value I4. Next, in the case of transferring the data <1> (in the case of discharging), discharge is performed to decrease the voltage of the data bus DBUS when the signal DSW rises to the "H" level; therefore, the power supply current ICC changes to a current value I7. Furthermore, discharge is performed to decrease the voltage of the data latch circuit XDL when the signals ST1 and XTI rise to the "H" level; therefore, the power supply current ICC changes to a current value I8. Subsequently, in the case of transferring the data (in the case of charging), the data bus DBUS is charged when the signal DSW rises to the "H" level; therefore, the power supply current ICC changes to the current value I4. During the subsequent data transfer, discharge and charge are repeatedly performed; and at the time of charging, as with the time of transferring the data <0>, the power supply current ICC changes to the current value I4 when the signal DSW rises to the "H" level. On the other hand, at the time of discharging, as with the time of transferring the data <1>, the power supply current ICC changes to the current value I7 when the signal DSW rises to the "H" level. Furthermore, the power supply current ICC changes to the current value I8 when the signals STI and XTI rise to the "H" level.

Also, in the example shown in FIG. 24, in the case of transferring the data <0> (in the case of discharging), the data bus DBUS is at the "L" level in the initial state when the signal DSW rises to the "H" level; therefore, the power supply current ICC hardly changes. In the subsequent transfer of the data <1> and the subsequent data, the power supply current ICC changes to the current value I4 at the time of charging, and to the current values I7 and I8 at the time of discharging, in a manner similar to the example shown in FIG. 23.

Figure 25:
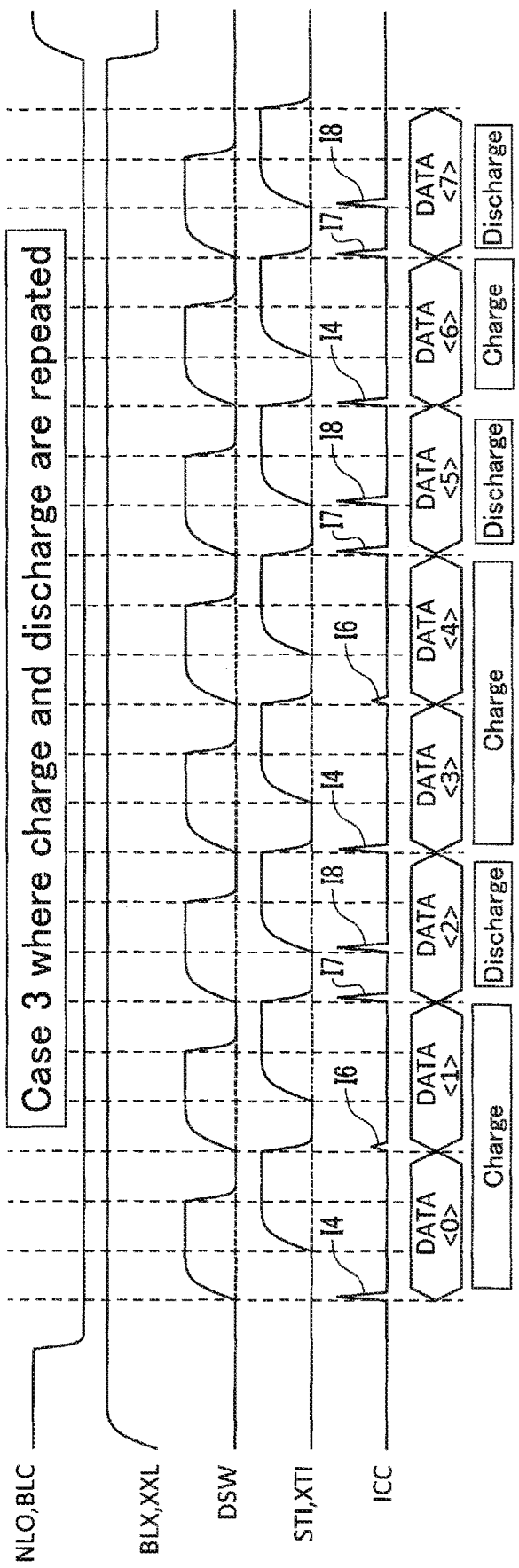

FIG. 25 shows a case where the "H" level and the "L" level are randomly transferred; that is, a case where charge and discharge are randomly performed during the data transfer from the data latch circuit SDL to the data latch circuit XDL. In this example, in the case of transferring the data <0> (in the case of charging), the data bus DBUS is charged when the signal DSW rises to the "H" level; therefore, the power supply current ICC changes to the current value I4. Subsequently, in the transfer of the data <1>, charge is continuously performed; therefore, the power supply current ICC changes to the current value I6, which is smaller than the current value I4. In the subsequent transfer of the data <2> and the subsequent data, the power supply current ICC changes to the current value I4 at the time of charging, and to the current values I7 and I8 at the time of discharging, in a manner similar to the examples shown in FIGS. 23 and 24. When charge is continuously performed, the power supply current ICC changes to the current value I6, which is smaller than the current value I4.

2.3. Advantageous Effects of Second Embodiment

According to the second embodiment, like the first embodiment, a semiconductor memory device capable of accelerating a read operation can be provided.

Also, in the second embodiment, the data bus DBUS can be pre-charged to the "H" level by controlling the signals DPCn and XTI. As a result, it is possible to handle various operations that require charging of the data bus DBUS to the "H" level in advance. The other advantageous effects are the same as those of the first embodiment described above.

3. Other Modifications, Etc.

In the above-described embodiments, a NAND flash memory is described as an example of the semiconductor memory device. However, the above-described embodiments can be applied to not only a NAND flash memory but also other semiconductor memories in general. Moreover, the above-described embodiments can be applied to various memory devices other than a semiconductor memory.

Each embodiment relating to the present invention may adopt the configurations described below. For example, when the memory cell transistors MT can store 2-bit (four-value) data, and the threshold levels at the time of storing one of four values are defined as level E (erased level), level A, level B, and level C in ascending order, the following configurations may be adopted.

(1) In the read operation, a voltage to be applied to a word line selected for an A-level read operation is, for example, in the range of 0 V to 0.55 V. The range of the voltage is not limited thereto, and may be any one of the range of 0.1 V to 0.24 V, the range of 0.21 V to 0.31 V, the range of 0.31 V to 0.4 V, the range of 0.4 V to 0.5 V, or the range of 0.5 V to 0.55 V.

A voltage to be applied to a word line selected for a B-level read operation is, for example, in the range of 1.5 V to 2.3 V. The range of the voltage is not limited thereto, and may be any one of the range of 1.65 V to 1.8 V, the range of 1.8 V to 1.95 V, the range of 1.95 V to 2.1 V, or the range of 2.1 V to 2.3 V.

A voltage to be applied to a word line selected for a C-level read operation is, for example, in the range of 3.0 V to 4.0 V. The range of the voltage is not limited thereto, and may be any one of the range of 3.0 V to 3.2 V, the range of 3.2 V to 3.4 V, the range of 3.4 V to 3.5 V, the range of 3.5 V to 3.6 V, or the range of 3.6 V to 4.0 V.

The read operation time (tR) may be, for example, in the range of 25 µs to 38 µs, the range of 38 µs to 70 µs, or the range of 70 µs to 80 µs.

(2) The write operation includes a program operation and a verify operation, as described above. In the write operation, a voltage to be first applied to a word line selected in the program operation is, for example, in the range of 13.7 V to 14.3 V. The voltage is not limited thereto, and may be, for example, in the range of 13.7 V to 14.0 V or the range of 14.0 V to 14.6 V.

A voltage to be first applied to a selected word line at the time of writing an odd-numbered word line, and a voltage to be first applied to a selected word line at the time of writing an even-numbered word line may be changed.

When the program operation is an incremental step pulse program (ISPP) scheme, the step-up voltage is, for example, approximately 0.5 V.

A voltage to be applied to a non-selected word line may be, for example, in the range of 6.0 V to 7.3 V. The voltage is not limited thereto, and may be, for example, in the range of 7.3 V to 8.4 V, or 6.0 V or less.

A pass voltage to be applied may be changed depending on whether the non-selected word line is an odd- or even-numbered word line.

The write operation time (tProg) may be, for example, in the range of 1700 μs to 1800 μs, the range of 1800 μs to 1900 μs, or the range of 1900 μs to 2000 μs.

(3) In the erase operation, a voltage to be first applied to a well which is formed above the semiconductor substrate and above which the aforementioned memory cell is disposed is, for example, in the range of 12 V to 13.6 V. The voltage is not limited thereto, and may be, for example, in the range of 13.6 V to 14.8 V, the range of 14.8 V to 19.0 V, the range of 19.0 V to 19.8 V, or the range of 19.8 V to 21 V.

The erase operation time (tErase) may be, for example, in the range of 3000 μs to 4000 μs, the range of 4000 μs to 5000 μs, or the range of 4000 μs to 9000 μs.

(4) The structure of the memory cell includes a charge storage layer disposed on the semiconductor substrate (silicon substrate) via a tunnel insulating film having a thickness in the range of 4 to 10 nm. This charge storage layer may have a stacked structure of an insulation film of SiN, SiON, or the like, having a thickness in the range of 2 to 3 nm, and polysilicon having a thickness in the range of 3 to 8 nm. The polysilicon may include a metal such as Ru, An insulation film is provided on the charge storage layer. This insulation film includes, for example, a silicon oxide film having a thickness in the range of 4 to 10 nm, which is interposed between a lower High-k film having a thickness in the range of 3 to 10 nm and a higher High-k film having a thickness in the range of 3 to 10 nm. Examples of the High-k film include HfO. The thickness of the silicon oxide film may be larger than that of the High-k film. A control electrode having a thickness in the range of 30 nm to 70 nm is formed on the insulation film via a material for adjusting a work function having a thickness in the range of 3 to 10 nm. The material for adjusting the work function is a metal-oxide film, such as TaO, and a metal-nitride film, such as TaN. For example, W may be used for the control electrode.

An air gap may be formed between memory cells. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor memory device comprising:
   a bit line electrically connected to a memory cell;
   a first node electrically connected to the bit line;
   a first driver configured to increase a voltage of the first node to a first voltage;
   a first buffer circuit configured to store data based on the voltage of the first node;
   a bus electrically connected to the first buffer circuit;
   a first transistor electrically connected between the first node and the bus;
   a second transistor electrically connected between the first buffer circuit and the bus; and
   a second buffer circuit electrically connected to the bus, wherein:
   the first buffer circuit includes a third transistor electrically connected to the second transistor;
   the first buffer circuit is electrically connected to an input terminal of the first driver;
   an output terminal of the first driver is electrically connected to a second node between the bit line and the first node;
   the first driver changes a voltage of the bus based on the data stored in the first buffer circuit; and
   the voltage of the bus is decreased or increased by setting the first transistor and the second transistor to a conducting state.

2. The semiconductor memory device according to claim 1, further comprising a fourth transistor electrically connected between the bit line and the first node,
   wherein the fourth transistor is set to a non-conducting state while the voltage of the bus is decreased or increased.

3. The semiconductor memory device according to claim 1, wherein:
   the first driver includes a first n-channel MOS field-effect transistor and a first p-channel MOS field-effect transistor;
   the first n-channel MOS field-effect transistor is set to a conducting state while the voltage of the bus is decreased; and
   the first p-channel MOS field-effect transistor is set to a conducting state while the voltage of the bus is increased.

4. The semiconductor memory device according to claim 1, wherein:
   the first buffer circuit includes a latch circuit including a first inverter and a second inverter, the first inverter and the second inverter each including an input terminal and an output terminal, the input terminal of the first inverter and the output terminal of the second inverter being electrically connected to each other, the input terminal of the second inverter and the output terminal of the first inverter being electrically connected to each other;
   the output terminal of the first inverter is electrically connected to the input terminal of the first driver; and
   the output terminal of the second inverter is electrically connected to the second transistor.

5. The semiconductor memory device according to claim 4, wherein:
   the second inverter includes a second n-channel MOS field-effect transistor and a second p-channel MOS field-effect transistor; and
   while the voltage of the bus is decreased, the second n-channel MOS field-effect transistor is set to a conducting state, and the second p-channel MOS field-effect transistor is set to a non-conducting state.

6. The semiconductor memory device according to claim 1, wherein the first driver increases the bit line to the first voltage before decreasing or increasing the voltage of the bus.

7. The semiconductor memory device according to claim 1, wherein the first transistor is set to a conducting state before the second transistor is set to a conducting state.

8. The semiconductor memory device according to claim 1, further comprising a fifth transistor including a first terminal electrically connected to the bus and a second terminal supplied with the first voltage; and
   a sixth transistor electrically connected between the bus and the second buffer circuit.

9. A semiconductor memory device comprising:
   a bit line electrically connected to a memory cell;
   a first transistor electrically connected to the bit line;
   a second transistor electrically connected to the first transistor via a first node;

a first driver electrically connected to the first node and configured to apply a first voltage to the bit line;
a third transistor electrically connected to the second transistor via a second node;
a bus electrically connected to the third transistor;
a fourth transistor including a gate electrically connected to the second node;
a first storage circuit including a first terminal and a second terminal, the first terminal being electrically connected to the fourth transistor;
a fifth transistor electrically connected between the first terminal of the first storage circuit and the bus; and
a second storage circuit electrically connected to the bus, wherein:
the first storage circuit includes a sixth transistor electrically connected to the fifth transistor;
the second terminal of the first storage circuit is electrically connected to an input terminal of the first driver;
an output terminal of the first driver is electrically connected to the first node between the first transistor and the second transistor;
the first driver decreases or increases a voltage of the bus based on a voltage of the second terminal of the first storage circuit; and
the voltage of the bus is decreased or increased by setting the third transistor and the fifth transistor to a conducting state.

10. The semiconductor memory device according to claim 9, wherein the second transistor is set to a non-conducting state while the voltage of the bus is decreased or increased.

11. The semiconductor memory device according to claim 9, wherein:
the first driver includes a first n-channel MOS field-effect transistor and a first p-channel MOS field-effect transistor;
the first n-channel MOS field-effect transistor is set to a conducting state while the voltage of the bus is decreased; and
the first p-channel MOS field-effect transistor is set to a conducting state while the voltage of the bus is increased.

12. The semiconductor memory device according to claim 9, wherein:
the first storage circuit includes a latch circuit including a first inverter and a second inverter, the first inverter and the second inverter each including an input terminal and an output terminal, the input terminal of the first inverter and the output terminal of the second inverter being electrically connected to each other, the input terminal of the second inverter and the output terminal of the first inverter being electrically connected to each other;
the output terminal of the first inverter is electrically connected to the input terminal of the first driver; and
the output terminal of the second inverter is electrically connected to the fifth transistor.

13. The semiconductor memory device according to claim 12, wherein:
the second inverter includes a second n-channel MOS field-effect transistor and a second p-channel MOS field-effect transistor; and
while the voltage of the bus is decreased, the second n-channel MOS field-effect transistor is set to a conducting state, and the second p-channel MOS field-effect transistor is set to a non-conducting state.

14. The semiconductor memory device according to claim 9, wherein the first driver increases the bit line to the first voltage before decreasing or increasing the voltage of the bus.

15. The semiconductor memory device according to claim 9, wherein the third transistor is set to a conducting state before the fifth transistor is set to a conducting state.

16. The semiconductor memory device according to claim 9, further comprising:
a seventh transistor including a first terminal electrically connected to the bus and a second terminal supplied with the first voltage; and
an eighth transistor electrically connected between the bus and the second storage circuit.

* * * * *